United States Patent
Song et al.

(10) Patent No.: US 11,218,651 B2
(45) Date of Patent: Jan. 4, 2022

(54) IMAGE SENSOR PACKAGE

(71) Applicant: SAMSUNG ELECTRONICS CO., LTD., Suwon-si (KR)

(72) Inventors: In-Sang Song, Suwon-si (KR); Hyunsu Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/786,472

(22) Filed: Feb. 10, 2020

(65) Prior Publication Data
US 2020/0366853 A1    Nov. 19, 2020

(30) Foreign Application Priority Data

May 16, 2019  (KR) .................... 10-2019-0057286

(51) Int. Cl.
*H04N 5/33*  (2006.01)

(52) U.S. Cl.
CPC ..................................... *H04N 5/33* (2013.01)

(58) Field of Classification Search
None
See application file for complete search history.

(56) References Cited

U.S. PATENT DOCUMENTS

| | | | |
|---|---|---|---|
| 5,448,105 A * | 9/1995 | Katoh | H01L 23/4334 257/666 |
| 6,198,165 B1 * | 3/2001 | Yamaji | H01L 23/3128 257/668 |
| 6,207,550 B1 * | 3/2001 | Hase | H05K 3/4007 438/613 |
| 7,071,032 B2 | 7/2006 | Hsu et al. | |
| 7,932,161 B2 | 4/2011 | Apanius et al. | |
| 8,912,078 B1 | 12/2014 | Lei et al. | |
| 8,940,619 B2 | 1/2015 | Lei et al. | |
| 8,969,177 B2 | 3/2015 | Chowdhury et al. | |
| 9,224,625 B2 | 12/2015 | Lei et al. | |
| 9,299,614 B2 | 3/2016 | Holden et al. | |
| 9,679,797 B2 | 6/2017 | Takamoto et al. | |
| 2003/0234886 A1 * | 12/2003 | Cho | H04N 5/2253 348/340 |
| 2007/0010041 A1 | 1/2007 | Kang et al. | |
| 2007/0054984 A1 * | 3/2007 | Jun | H05K 3/323 523/204 |
| 2007/0215992 A1 * | 9/2007 | Shen | H01L 24/83 257/668 |
| 2008/0093721 A1 * | 4/2008 | Kang | H01L 27/14618 257/680 |
| 2012/0282735 A1 * | 11/2012 | Ahn | H01L 21/6835 438/109 |
| 2016/0260761 A1 * | 9/2016 | Jun | H01L 27/14636 |
| 2016/0351486 A1 * | 12/2016 | Jung | H01L 21/6835 |
| 2019/0006199 A1 * | 1/2019 | Tsou | H01L 21/56 |
| 2020/0006214 A1 * | 1/2020 | Tsai | H01L 24/92 |
| 2020/0013701 A1 * | 1/2020 | Magana | H01L 23/4951 |

* cited by examiner

*Primary Examiner* — Frederick D Bailey
(74) *Attorney, Agent, or Firm* — Sughrue Mion, PLLC

(57) ABSTRACT

An image sensor chip includes a substrate; an image sensor chip provided on the substrate; and an adhesive film provided between the image sensor chip and the substrate in a semi-cured state. A first width of the adhesive film is equal to a second width of the image sensor chip.

17 Claims, 26 Drawing Sheets

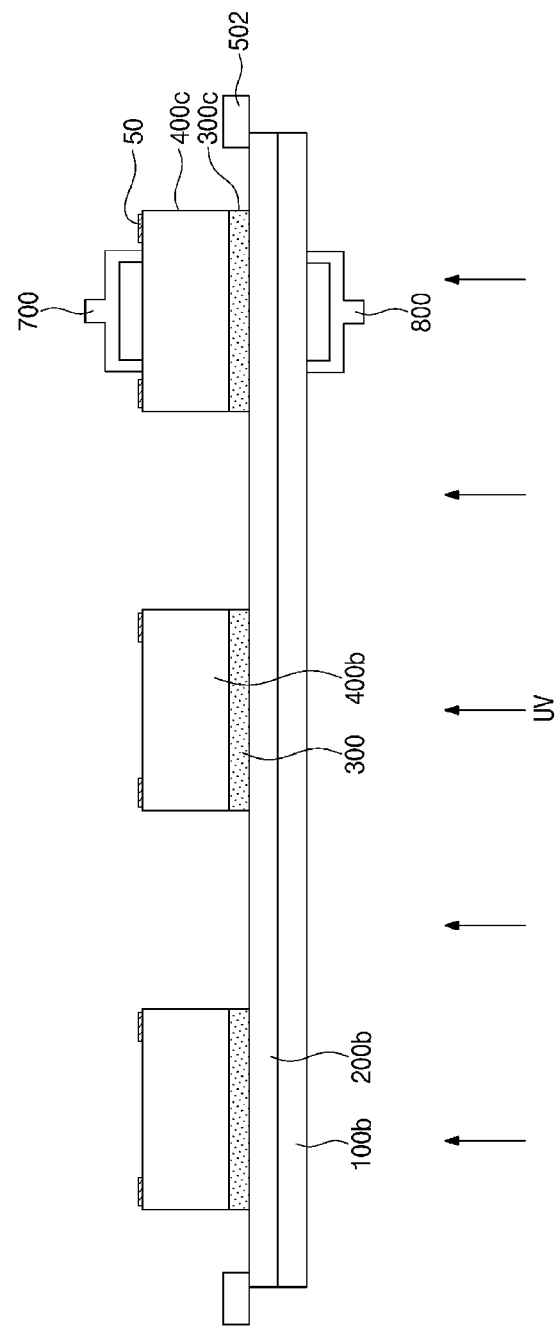

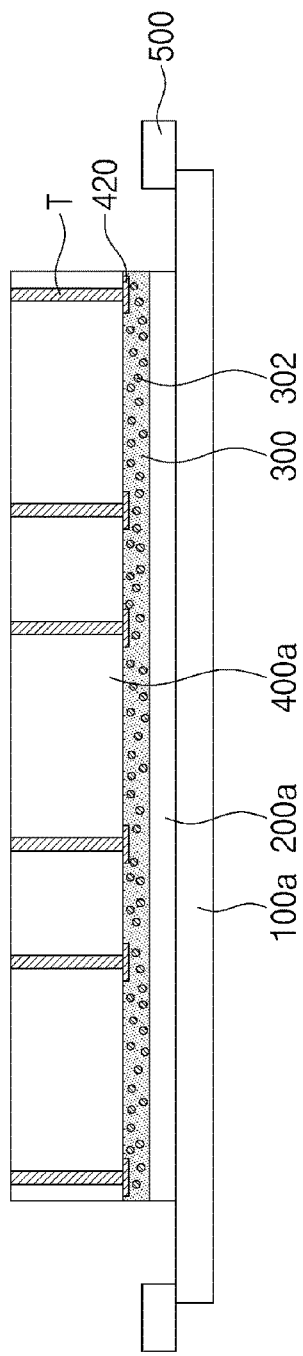
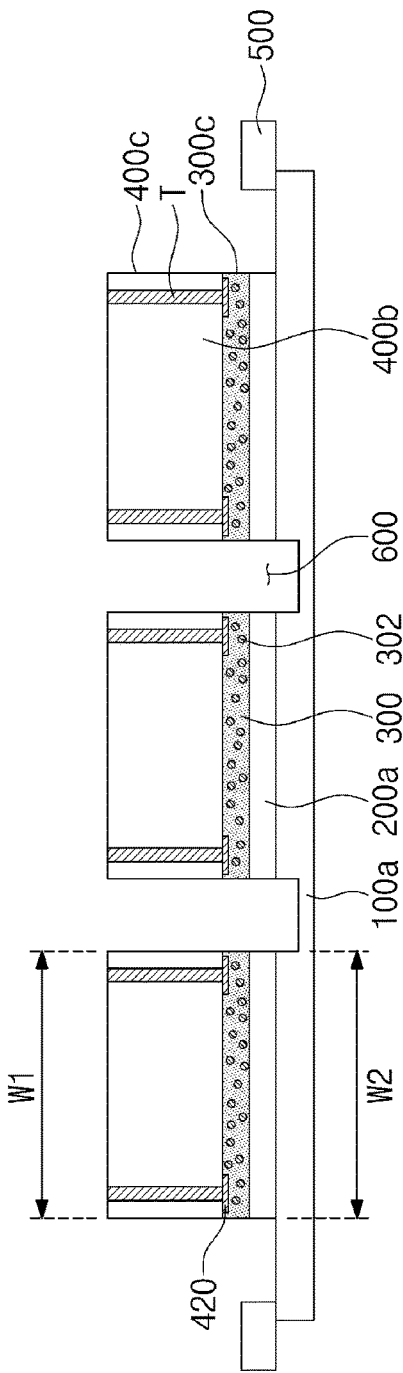

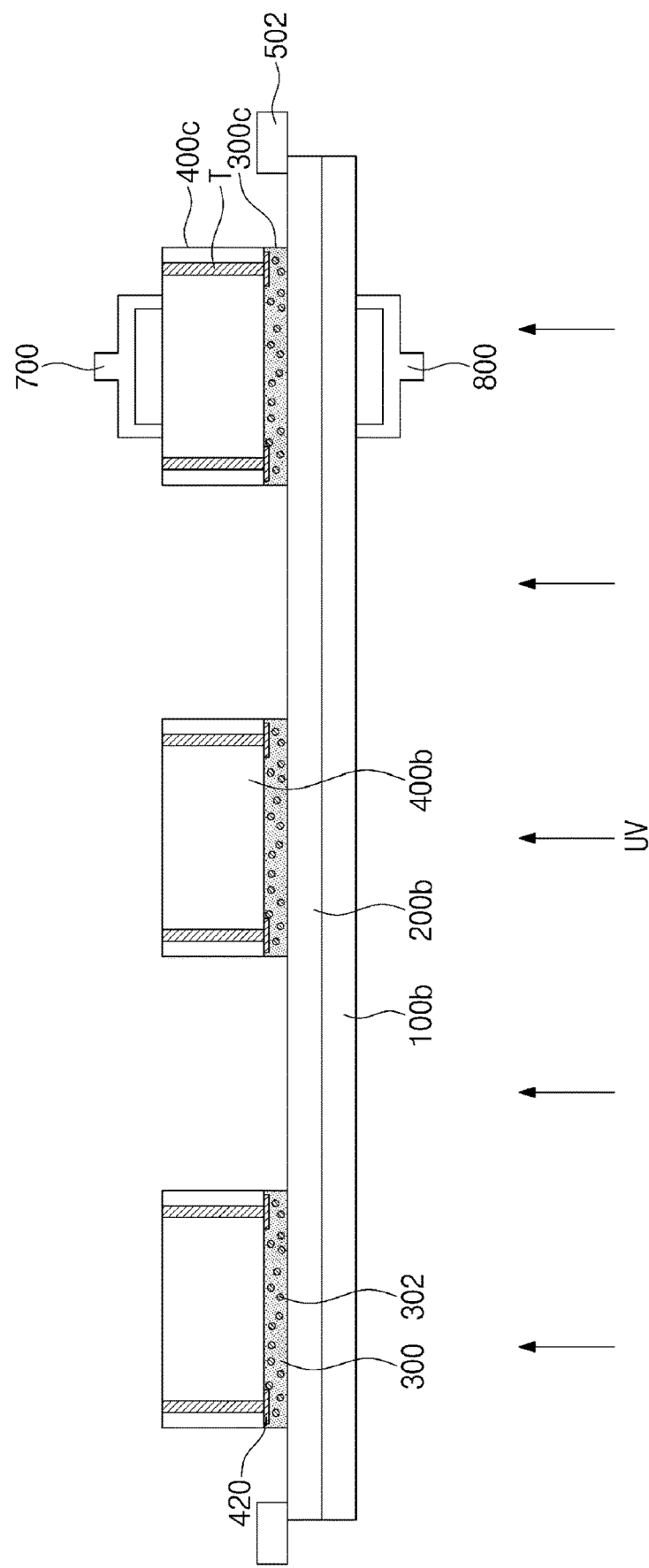

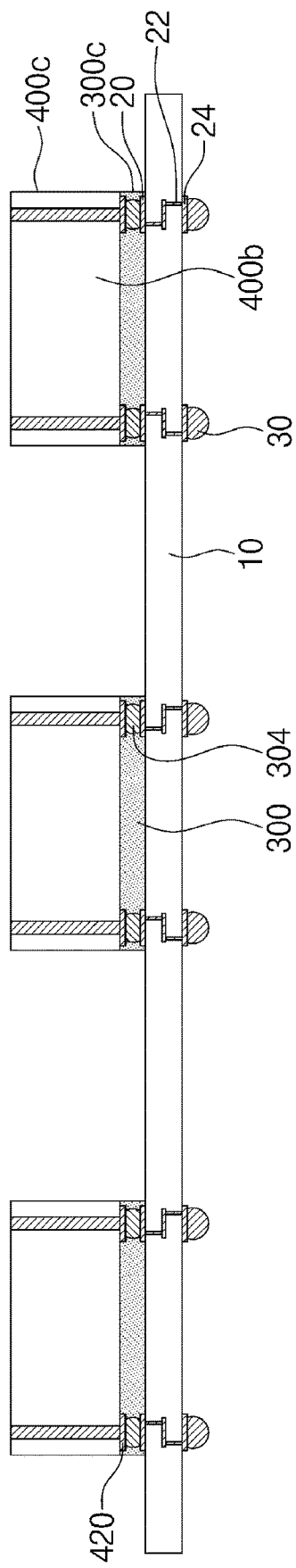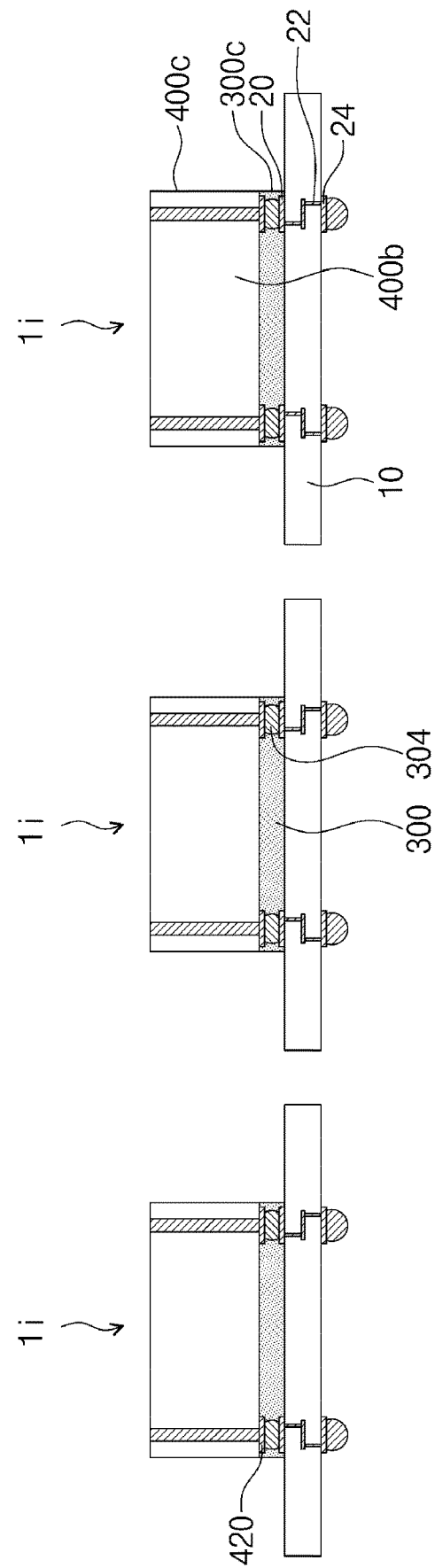

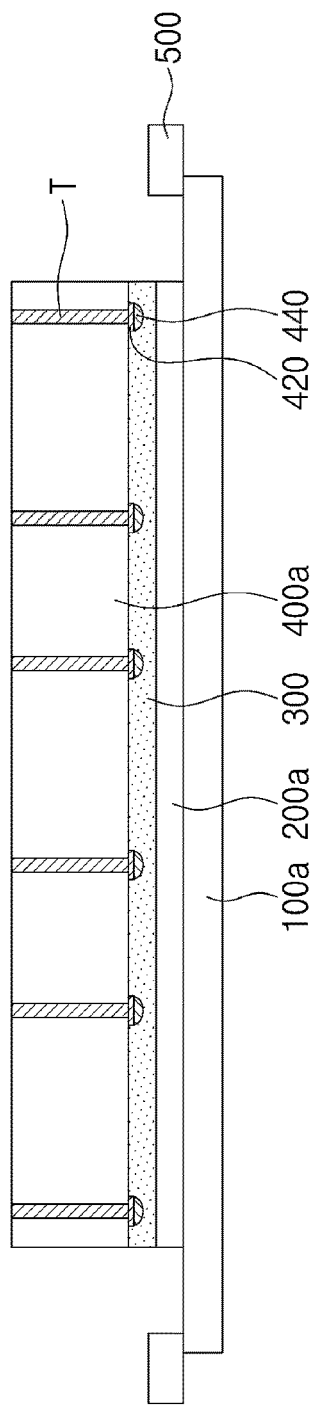
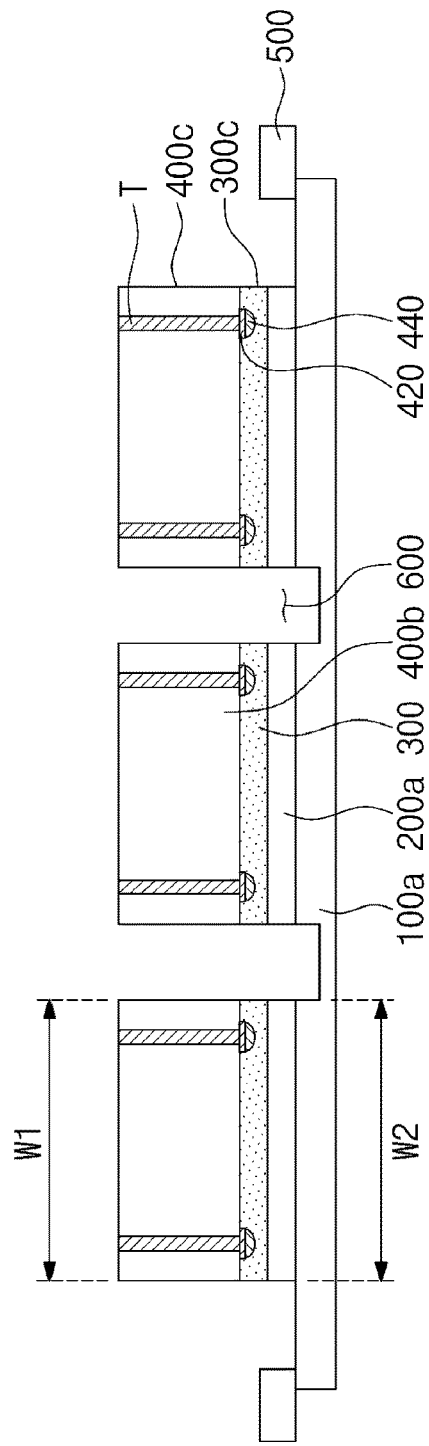

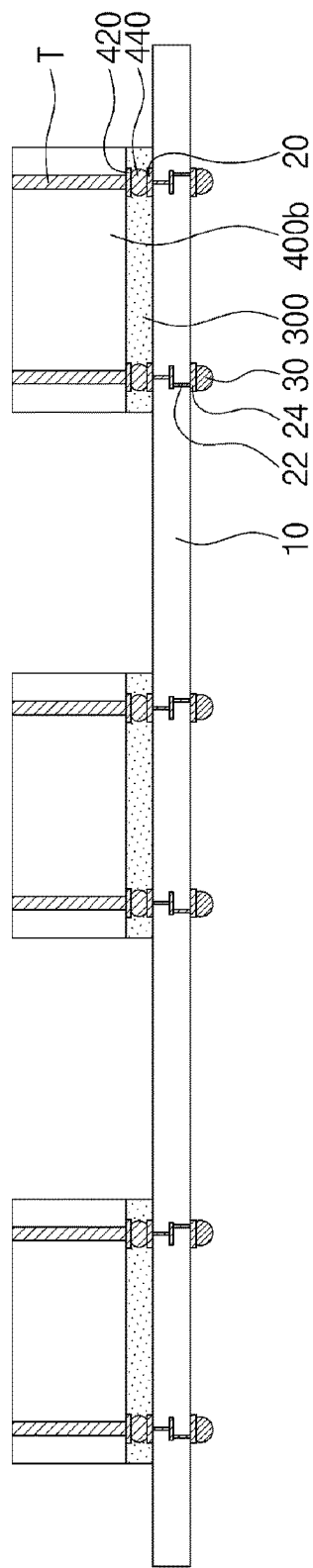
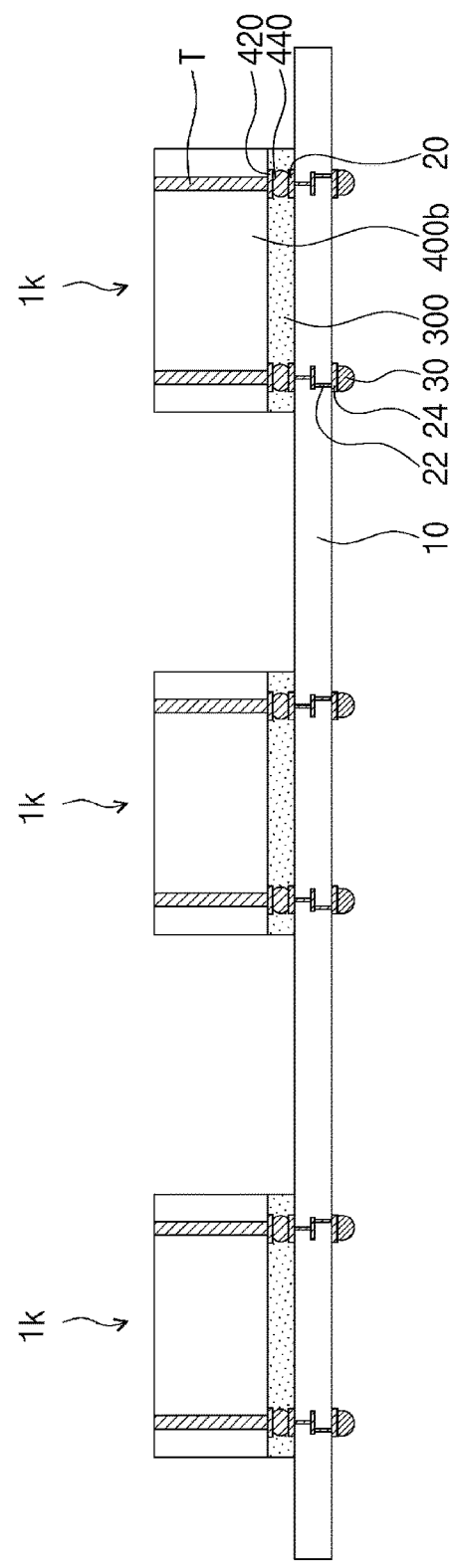

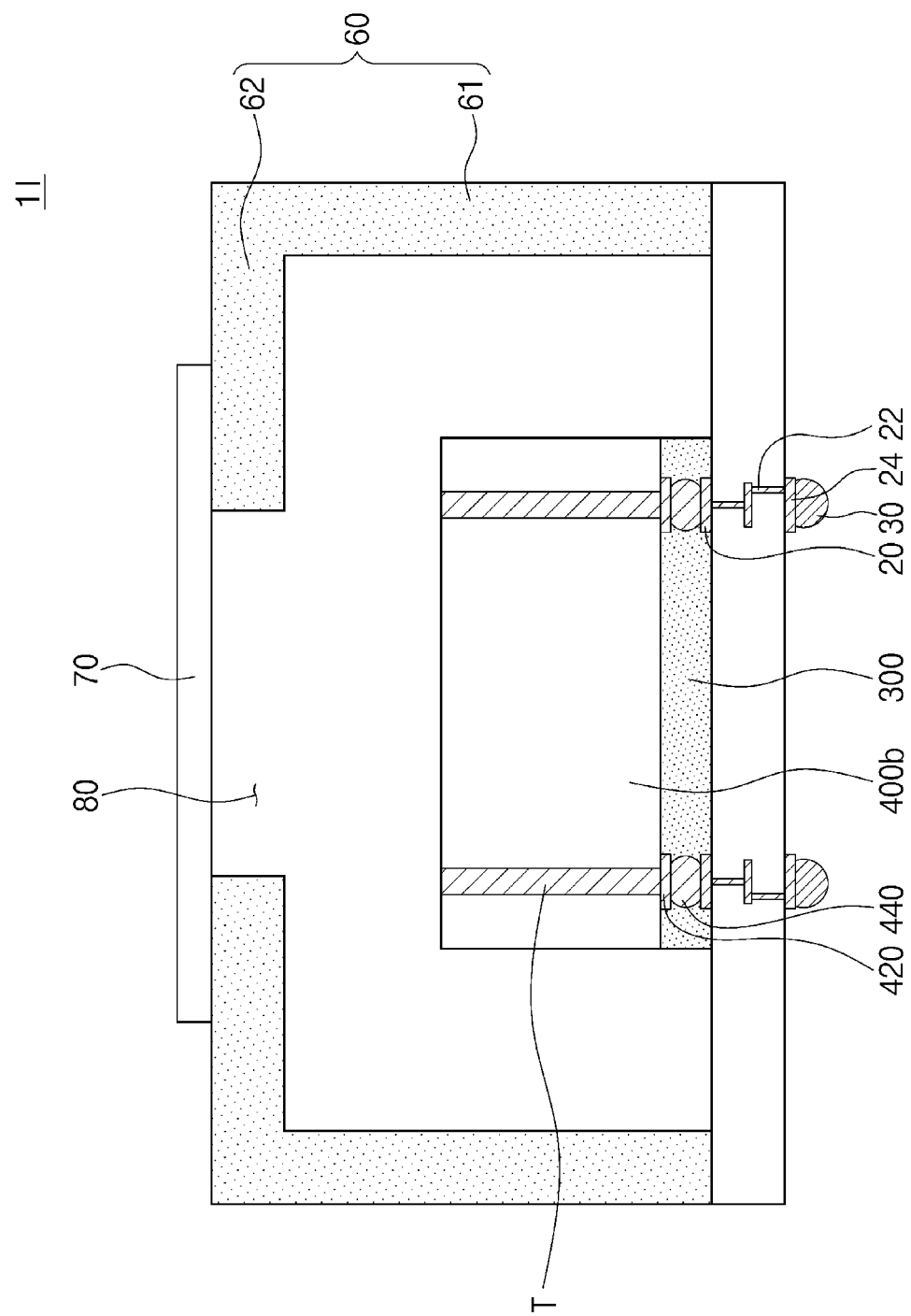

IMAGE SENSOR PACKAGE

CROSS-REFERENCE TO RELATED APPLICATION

This U.S. non-provisional application claims priority under 35 U.S.C § 119 to Korean Patent Application No. 10-2019-0057286 filed on May 16, 2019 in the Korean Intellectual Property Office, the disclosure of which is hereby incorporated by reference in its entirety.

BACKGROUND

1. Field

Apparatuses consistent with example embodiments relate to an image sensor package, and more particularly, to an image sensor package to which an adhesive film is applied.

2. Description of Related Art

An image sensor is a device which converts one-dimensional or two-dimensional optical information into electric signals. The image senor may be categorized into, for example, a complementary metal oxide semiconductor (CMOS) image sensor and a charge coupled diode (CCD) image sensor. The image sensor is used for cameras, camcorders, multimedia personal computers, and surveillance cameras, and its usage has been growing exponentially.

In the semiconductor industry, the demands for semiconductor devices with increased capacity, reduced thickness and reduced overall size and electronic products incorporating such semiconductor devices have increased, and thus various package manufacturing techniques have been examined.

In the related art, epoxy polymer is used to attach an image sensor chip to a substrate. Because the substrate is coated thereon with a liquid epoxy polymer, the image sensor chip in a tilted state is attached to the substrate, which may result in a reduction in manufacturing yield.

SUMMARY

One or more example embodiments of the disclosure provide an image sensor package with increased yield and a semiconductor module including the same.

According to an aspect of an example embodiment, an image sensor package may include: a substrate; an image sensor chip provided on the substrate; and an adhesive film provided between the image sensor chip and the substrate. A width of the adhesive film is equal to a width of the image sensor chip.

According to an aspect of another example embodiment, an image sensor package may include: a substrate; an image sensor chip provided on the substrate; and an adhesive film provided between the image sensor chip and the substrate. Lateral surfaces of the adhesive film are coplanar with corresponding lateral surfaces of the image sensor chip in a thickness direction of the image sensor package.

BRIEF DESCRIPTION OF THE DRAWINGS

FIGS. 1A to 1H illustrate cross-sectional views describing a method of manufacturing an image sensor package according to an example embodiment;

FIGS. 4A to 4H illustrate cross-sectional views describing a method of manufacturing an image sensor package according to an example embodiment;

FIGS. 6A to 6E illustrate cross-sectional views describing a method of manufacturing an image sensor package according to an example embodiment; and FIG. 7 illustrates a cross-sectional view of an image sensor package according to an example embodiment.

DETAILED DESCRIPTION OF EMBODIMENTS

Figure 1A:
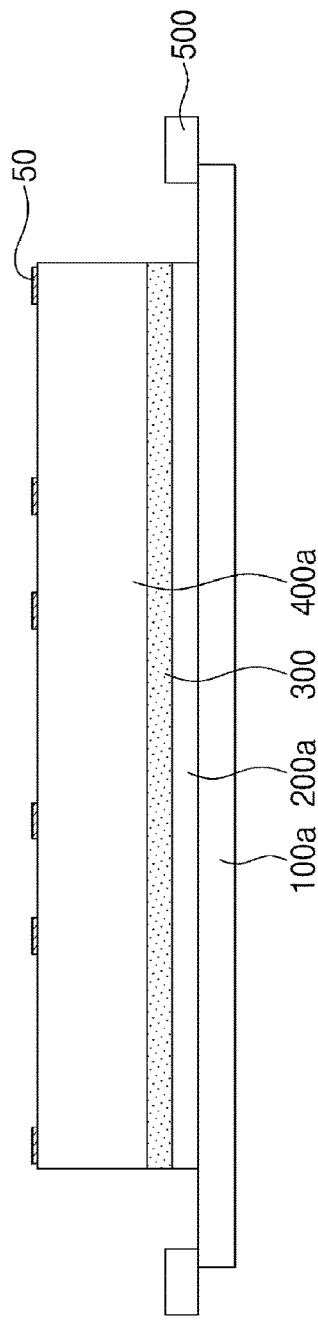

In this description, like reference numerals may indicate like components. The following will now describe an image sensor package and a method of manufacturing the same according to the present inventive concepts.

FIGS. 1A to 1H illustrate cross-sectional views describing a method of manufacturing an image sensor package according to an example embodiment.

Referring to FIG. 1A, a first base film 100a may be prepared. A first fixing ring 500 may be attached to opposite ends of the first base film 100a. The first fixing ring 500 may serve to support the first base film 100a. A first intermediate layer 200a may be provided on a top surface of the first base film 100a. The first intermediate layer 200a may have adhesive properties. When the first intermediate layer 200a is irradiated with an ultraviolet ray, an adhesive force of the first intermediate layer 200a may change with a certain layer, for example, an adhesive film 300 which will be discussed below. An adhesive film 300 may be provided on a top surface of the first intermediate layer 200a. More specifically, the adhesive film 300 may be provided on a top surface of the first intermediate layer 200a in a half-cured state. In other words, the adhesive film 300 may be in a half-solid state. Afterwards, the adhesive film 300 may be annealed and then completely cured. A semiconductor wafer 400a may be provided on a top surface of the adhesive film 300. The semiconductor wafer 400a may be, for example, a silicon wafer. The semiconductor wafer 400a and the adhesive film 300 may be attached to each other. Chip connection pads 50 may be provided on a top surface of the semiconductor wafer 400a. The chip connection pads 50 may include a conductive material.

Figure 1B:
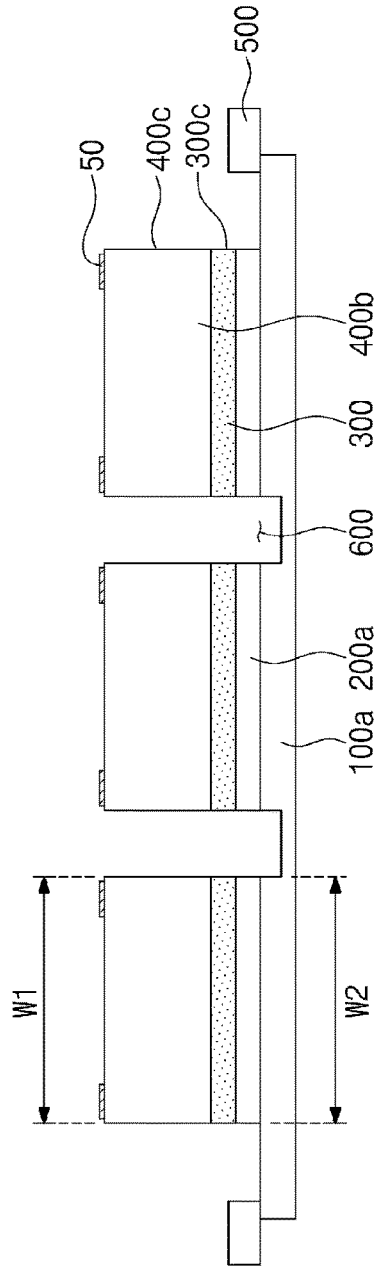

Referring to FIG. 1B, the semiconductor wafer 400a may be diced to form a plurality of image sensor chips 400b and grooves 600. The adhesive film 300 and the first intermediate layer 200a may also be diced together with the semiconductor wafer 400a. The grooves 600 may penetrate through the adhesive film 300, the first intermediate layer 200a, and an upper portion of the first base film 100a. The bottom surfaces of the grooves 600 may be provided in the first base film 100*a*. A lower portion of the first base film 100*a* may not be diced. When the semiconductor wafer 400*a* is diced, because the adhesive film 300 is diced together with the semiconductor wafer 400*a*, the adhesive film 300 may have lateral surfaces 300*c* coplanar with lateral surfaces 400*c* of the image sensor chip 400*b*. A width W1 of the image sensor chip 400*b* may be equal to a width W2 of the adhesive film 300. In plan view, the image sensor chip 400*b* may have the same area as that of the adhesive film 300.

Figure 1C:
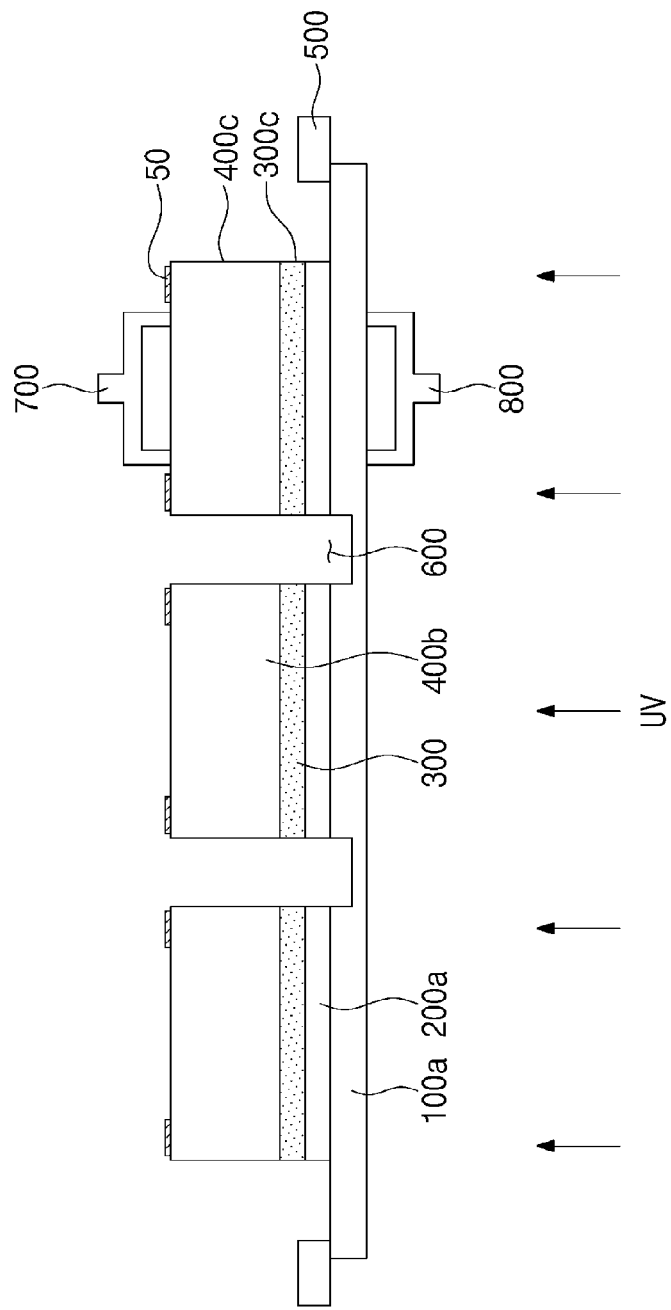

Referring to FIG. 1C, the first intermediate layer 200*a* may be irradiated with an ultraviolet ray. An adhesive force between the first intermediate layer 200*a* and the adhesive film 300 may be reduced after the first intermediate layer 200*a* is exposed to the ultraviolet ray. A chip collector 700 may be provided on a top surface of one of the image sensor chips 400*b* of the plurality of image sensor chips 400*b*. The chip collector 700 may grip onto the top surface of the image sensor chip 400*b*, and may lift up the image sensor chip 400*b*. The chip collector 700 may also transport one of the adhesive films 300 that is in contact with the image sensor chip 400*b*. The following will describe movement of the image sensor chip 400*b* and its corresponding adhesive film 300. The first intermediate layer 200*a* and the adhesive film 300 may be separated from each other in a vertical direction (i.e., in a thickness direction of the first intermediate layer 200*a* and the adhesive film 300). Thereafter, the chip collector 700 may convey the image sensor chip 400*b* and the adhesive film 300 detached from the first intermediate layer 200*a* to a desired position. An ejector pin 800 may be provided on a bottom surface (opposite to the top surface on which the chip collector 700 is provided) of the first base film 100*a*. The ejector pin 800 may grip onto the bottom surface of the first base film 100*a*, and may assist the first intermediate layer 200*a* and the adhesive film 300 to be separated from each other in the vertical direction. During the separation, the image sensor chip 400*b* may experience stress due to an action of the ejector pin 800. The adhesive film 300 may be interposed between the first base film 100*a* and a bottom surface of the image sensor chip 400*b*, and thus the stress may be alleviated. Accordingly, an image sensor package may employ the image sensor chip 400*b* having a small thickness. The employment of the thin image sensor chip 400*b* may reduce a thickness of the image sensor package and may also achieve compactness of products.

Figure 1D:
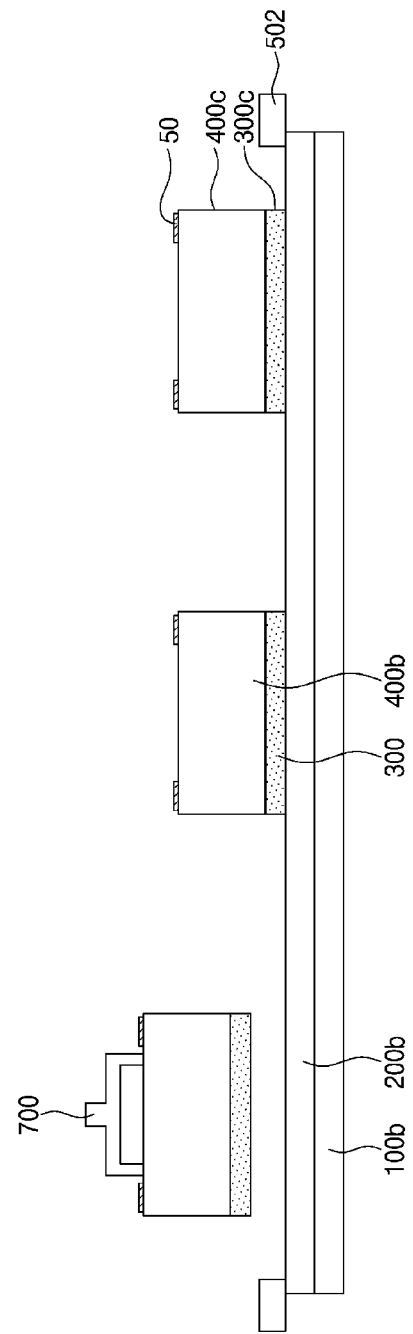

Referring to FIG. 1D, a second base film 100*b* may be prepared. The second base film 100*b* may be an individual component separated from the first base film 100*a*. A second intermediate layer 200*b* may be provided on a top surface of the second base film 100*b*. The second intermediate layer 200*b* may be an individual component separated from the first intermediate layer 200*a*. A second fixing ring 502 may be attached to opposite ends of the second intermediate layer 200*b*. The image sensor chip 400*b* and the adhesive film 300 that are held by the chip collector 700 as discussed in FIG. 1C may move toward a top surface of the second intermediate layer 200*b*, and then the image sensor chip 400*b* and the adhesive film 300 may be provided on a top surface of the second intermediate layer 200*b*. The chip collector 700 may also transport the adhesive film 300 attached to the image sensor chip 400*b*. The movement of the image sensor chip 400*b* and its corresponding adhesive film 300 may be repeatedly performed on a plurality of image sensor chips 400*b* and a plurality of adhesive films 300 attached respectively thereto.

Referring to FIG. 1E, the second intermediate layer 200*b* may be irradiated with an ultraviolet ray. Thereby, an adhesive force between the second intermediate layer 200*b* and the adhesive film 300 may be reduced after the second intermediate layer 200*b* is exposed to the ultraviolet ray. The chip collector 700 may hold onto a top surface of a specific one of the image sensor chips 400*b*, and may lift up the specific image sensor chip 400*b*. The chip collector 700 may transport one of the adhesive films 300 that is in contact with the specific image sensor chip 400*b*. Therefore, the second intermediate layer 200*b* and the adhesive film 300 may be separated from each other in the vertical direction. After that the separation, the chip collector 700 may covey the image sensor chip 400*b* (along with the adhesive film 300) to a desired position. The ejector pin 800 may act identically to that discussed in FIG. 1C. Hereinafter, a description overlapping with that discussed in FIG. 1C will be omitted to avoid redundancy.

Figure 1F:
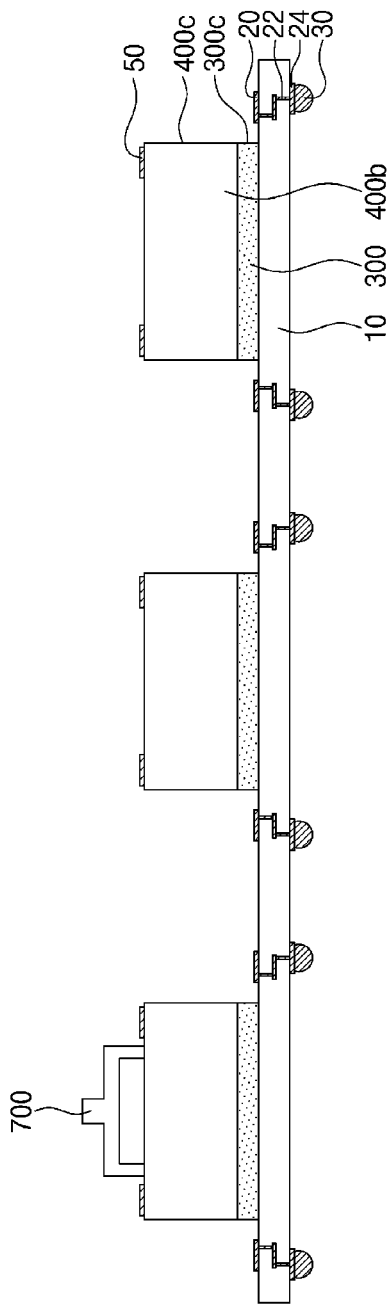

Referring to FIG. 1F, a substrate 10 may be prepared. Upper substrate pads 20 may be provided on a top surface of the substrate 10. Lower substrate pads 24 may be provided on a bottom surface of the substrate 10. The substrate 10 may include connectors 22 therein to connect the upper substrate pads 20 and the lower substrate pads 24. External terminals 30 may be provided on bottom surfaces of the lower substrate pads 24. The image sensor chip 400*b* held by the chip collector 700 as discussed in FIG. 1E may be transferred onto the top surface of the substrate 10, and then the substrate 10 may be provided thereon with the image sensor chip 400*b*. The chip collector 700 may also transport one of the adhesive films 300 that is in contact with the image sensor chip 400*b*. The adhesive film 300 may be interposed between the image sensor chip 400*b* and the substrate 10. The adhesive film 300 may attach the image sensor chip 400*b* to the top surface of the substrate 10. Accordingly, the image sensor chip 400*b* may be fixed to the top surface of the substrate 10.

Figure 1G:
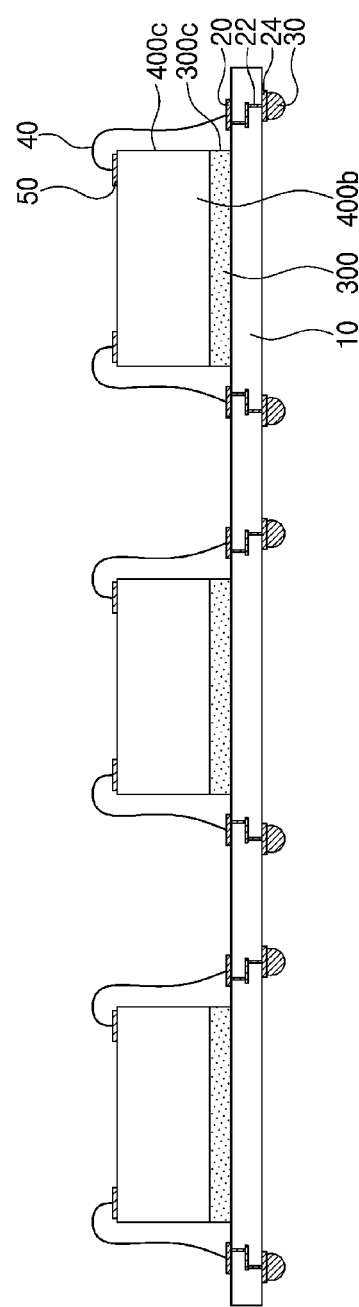

Referring to FIG. 1G, bonding wires 40 may be provided on the top surface of the substrate 10 to be connected to the chip connection pads 50 at one end and the upper substrate pads 20 at the other end.

Figure 1H:
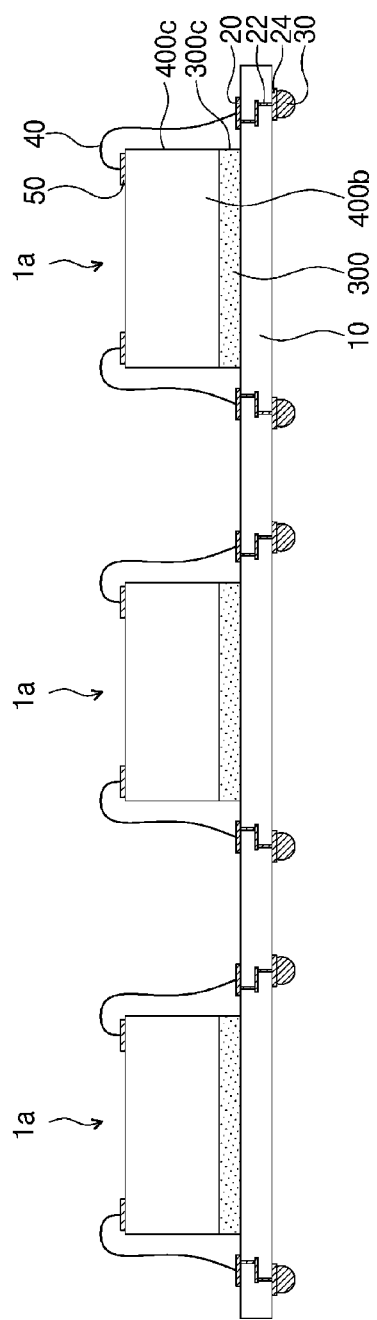

Referring to FIG. 1H, the substrate 10 may be diced to form a plurality of image sensor packages 1*a*. Each of the plurality of image sensor packages 1*a* may include the substrate 10, the adhesive film 300, and the image sensor chip 400*b*.

The following will describe in detail a single image sensor package 1*a*.

Figure 2A:
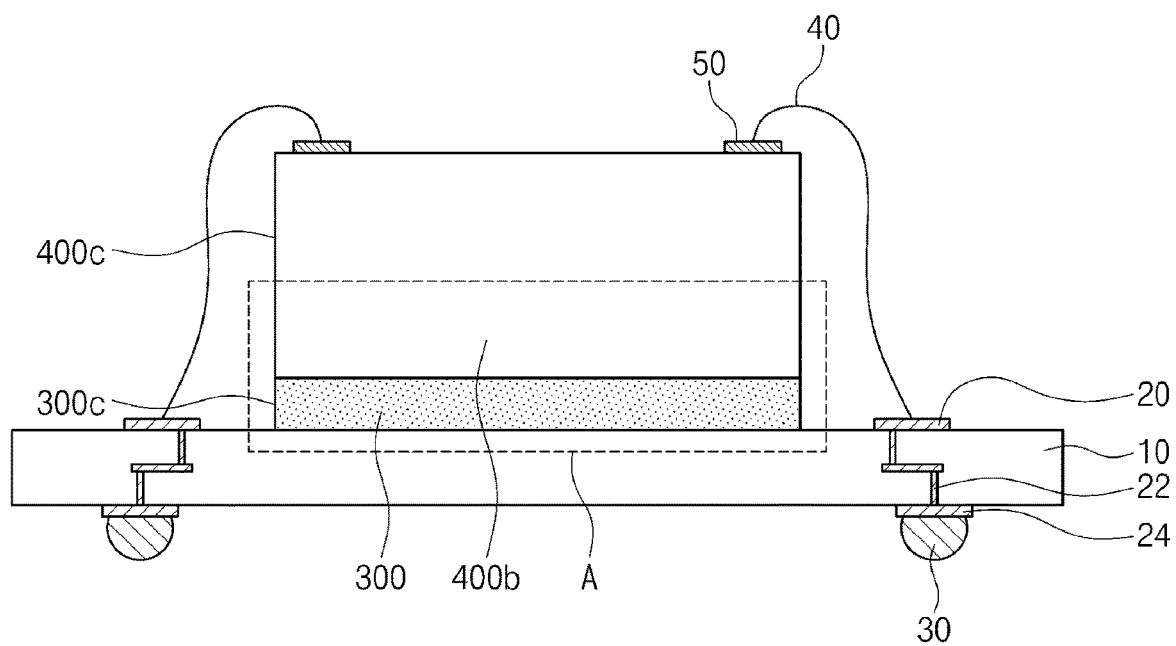
FIG. 2A illustrates a cross-sectional view of an image sensor package according to an example embodiment.
Figure 2B:
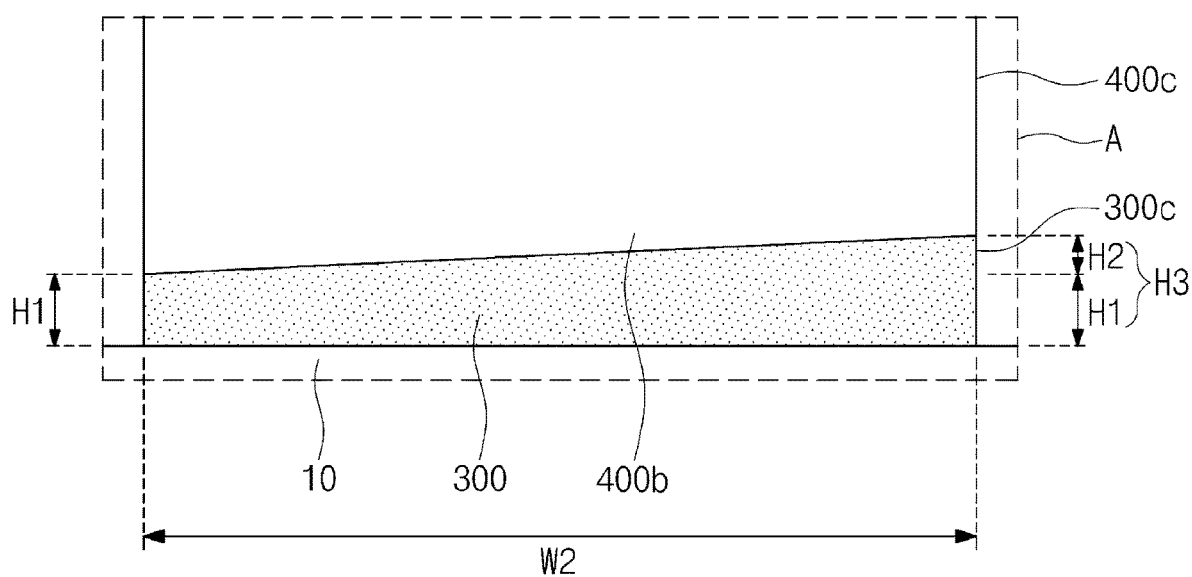
FIG. 2B illustrates an enlarged view showing section A of FIG. 2A.

FIG. 2A illustrates a cross-sectional view of an image sensor package 1*a* according to an example embodiment. FIG. 2B illustrates an enlarged view showing section A of FIG. 2A.

Referring to FIGS. 2A and 2B, an image sensor package 1*a* according to an example embodiment may include a substrate 10, an adhesive film 300, an image sensor chip 400*b*, and bonding wires 40. The image sensor package 1*a* may be manufactured as discussed above in conjunction with FIGS. 1A to 1H. The substrate 10 may be, for example, a printed circuit board (PCB). The substrate 10 may be provided with upper substrate pads 20 on a top surface thereof. The substrate 10 may be provided with lower substrate pads 24 on a bottom surface thereof. The substrate 10 may include connectors 22 therein. The connectors 22 may include vias and conductive patterns. The connectors 22 may penetrate the substrate 10 to electrically connect the upper substrate pads 20 and the lower substrate pads 24 to each other. External terminals 30 may be provided on a respective bottom surface of the lower substrate pads 24. The external terminals 30 may have, for example, a solderball shape. The upper substrate pads 20, the lower substrate pads 24, the connectors 22, and the external terminals 30 may be made up of a conductive material for electric conduction. For example, the conductive material may include copper (Cu). In this description, the phrase "electrically connected/coupled to" may include "directly or indirectly electrically connected/coupled to."

The adhesive film 300 may be provided on the top surface of the substrate 10. The adhesive film 300 may be interposed between the substrate 10 and the image sensor chip 400b. The adhesive film 300 may have lateral surfaces 300c coplanar with corresponding lateral surfaces 400c of the image sensor chip 400b along a thickness direction of the image sensor package 1a. When viewed in a plan view, the adhesive film 300 may have the same area as that of the image sensor chip 400b. The adhesive film 300 may include one or more of an adhesive polymer, a thermosetting polymer, and a dielectric polymer. For example, the adhesive film 300 may include an epoxy-based polymer and silica. The adhesive film 300 may have a glass transition temperature (Tg) ranging from about 140° C. to about 170° C. Therefore, the adhesive film 300 may be provided in a half-cured state. The adhesive film 300 may serve to attach and fix the image sensor chip 400b to the substrate 10. The adhesive film 300 may be annealed and then cured, and as a result, the image sensor chip 400b may be securely fixed to the substrate 10. The adhesive film 300 may have a thermal expansion coefficient less than that of an epoxy-based polymer. The higher a thermal expansion coefficient, the greater a difference H2 between minimum and maximum thicknesses H1 and H3 of the adhesive film 300 at opposite sides of the image sensor package 1a. For example, the difference H2 between the minimum and maximum thicknesses H1 and H3 of the adhesive film 300 may accelerate a tilting phenomenon of the image sensor chip 400b. When the adhesive film 300 is used, the tiling phenomenon of the image sensor chip 400b may be reduced in comparison with a case where an epoxy-based polymer is used.

A tilting degree of the image sensor chip 400b may be proportional to a ratio of the maximum thickness H3 to the minimum thickness H1 of the adhesive film 300 at opposite sides of the image sensor package 1a. When the adhesive film 300 is used to fix the image sensor chip 400b to the substrate 10, the ratio of the maximum thickness H3 to the minimum thickness H1 of the adhesive film 300 may be in a range of about 1 to about 1.15. In an example embodiment, the image sensor chip 400b may be slightly tilted to increase manufacturing yield.

The image sensor chip 400b may be provided on a top surface of the adhesive film 300. The image sensor chip 400b may include a complementary metal oxide semiconductor (CMOS) image sensor chip, or CIS(CMOS Image Sensor) chip. The image sensor chip 400b may sense objects and output electric signals according to the sensed objects. The image sensor chip 400b may include therein a circuit layer and the circuit layer may include integrated circuits. The electric signals output from the image sensor chip 400b may be transmitted through the bonding wires 40 to the substrate 10. Chip connection pads 50 may be provided on, for example, an edge region of a top surface of the image sensor chip 400b. The chip connection pads 50 may be made up of metal, for example, aluminum (Al).

The bonding wires 40 may contact the chip connection pads 50 at one end and the upper substrate pads 20 at the other end. The bonding wires 40 may be disposed adjacent to the lateral surfaces 400c of the image sensor chip 400b. The image sensor chip 400b may be electrically connected through the bonding wires 40 to the substrate 10. The bonding wires 40 may include a conductive material, for example, gold (Au), aluminum (Al), copper (Cu), or a combination thereof.

Figure 3A:
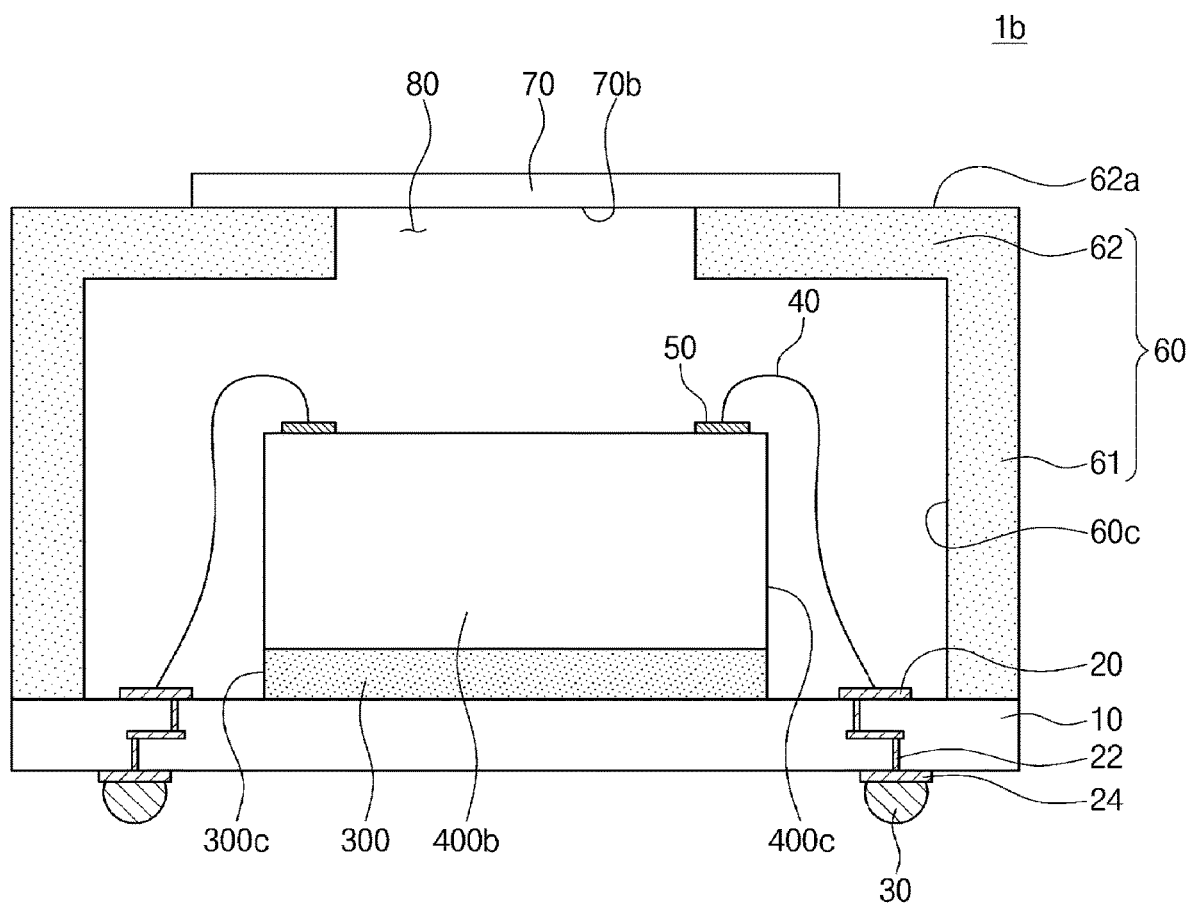
FIG. 3A illustrates a cross-sectional view of an image sensor package according to an example embodiment.

FIG. 3A illustrates a cross-sectional view of an image sensor package 1b according to an example embodiment.

Referring to FIG. 3A, an image sensor package 1b according to an example embodiment may include a substrate 10, an adhesive film 300, an image sensor chip 400b, bonding wires 40, a holder 60, and an infrared filter 70. The substrate 10, the adhesive film 300, the image sensor chip 400b, and the bonding wires 40 may be the same as those discussed in FIGS. 2A and 2B. Thus, duplicate descriptions of those elements will be omitted below.

The holder 60 may be provided on the substrate 10. The holder 60 may include a leg 61 and a body 62. The leg 61 may be provided on an edge region of a top surface of the substrate 10, surrounding the image sensor chip 400b. The body 62 may be provided over the substrate 10 and a top surface of the image sensor chip 400b. The leg 61 and the body 62 may be integrally connected to constitute the holder 60. The body 62 of the holder 60 may support the infrared filter 70. The holder 60 may surround the image sensor chip 400b and protect the image sensor chip 400b against external impact or foreign object. The holder 60 may be made up of a polymer, for example, an epoxy-based polymer.

The infrared filter 70 may be provided over the top surface of the image sensor chip 400b. Specifically, for example, the infrared filter 70 may be provided on a top surface of the body 62 of the holder 60. The infrared filter 70 may be vertically spaced apart from and may face the image sensor chip 400b. The infrared filter 70 may overlap the image sensor chip 400b along a vertical direction of the image sensor package 1b. The infrared filter 70 may selectively allow light to pass therethrough. For example, the infrared filter 70 may filter out an infrared ray amongst incident light. The top surface of the image sensor chip 400b may be exposed to light that passes through the infrared filter 70. An empty space 80 may be formed between the infrared filter 70 and the image sensor chip 400b. The empty space 80 may also be provided laterally between an inner sidewall 60c of the leg 61 and the lateral surfaces 400c of the image sensor chip 400b.

Figure 3B:
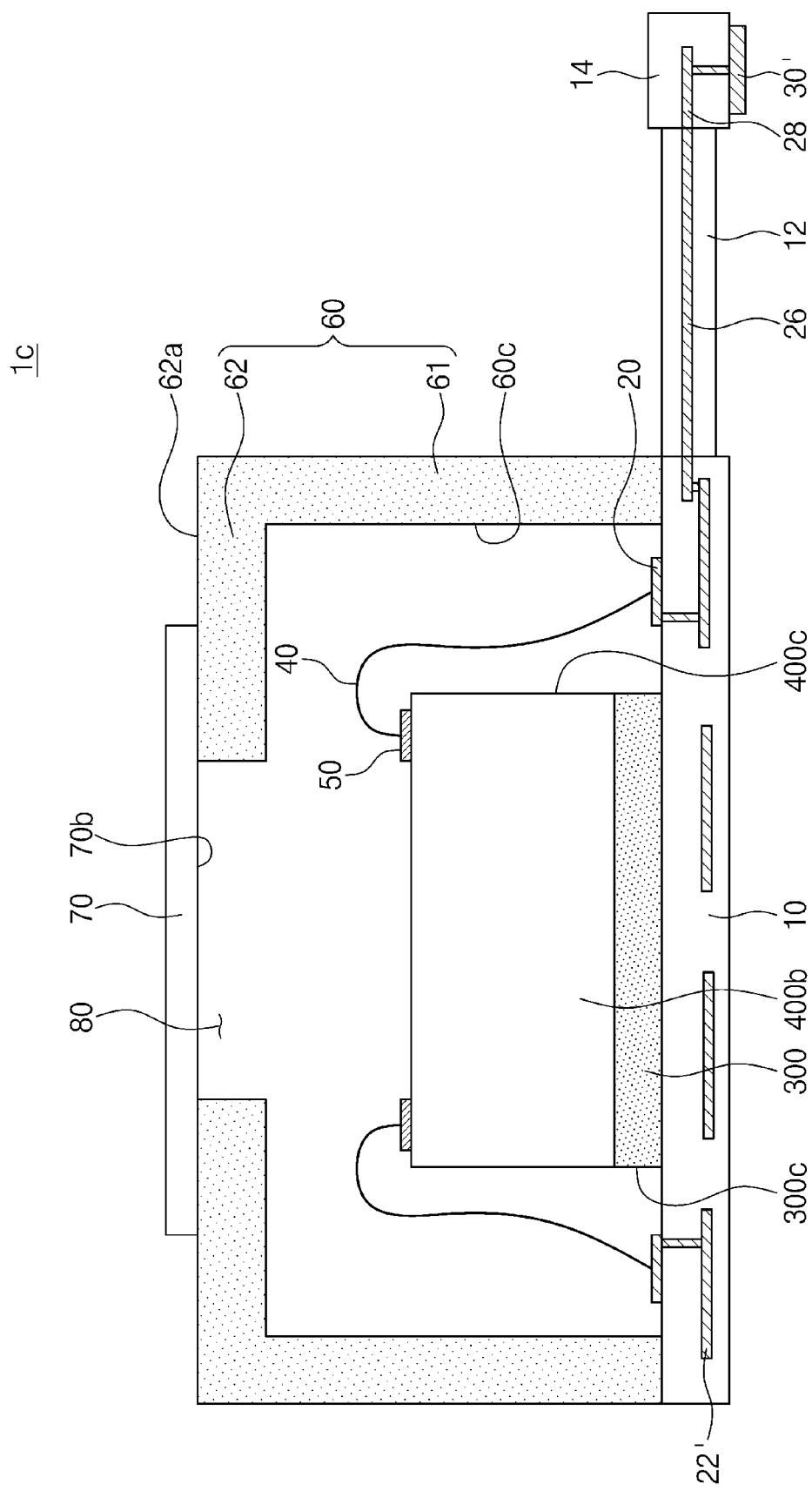
FIG. 3B illustrates a cross-sectional view of an image sensor package according to an example embodiment.

FIG. 3B illustrates a cross-sectional view of an image sensor package 1c according to an example embodiment.

Referring to FIG. 3B, an image sensor package 1c according to an example embodiment may include a substrate 10, an adhesive film 300, an image sensor chip 400b, bonding wires 40, a holder 60, and an infrared filter 70. The adhesive film 300, the image sensor chip 400b, and the bonding wires 40 may be the same as those discussed in FIGS. 2A and 2B. The holder 60 and the infrared filter 70 may be the same as those discussed in FIG. 3A. Thus, duplicate descriptions of those elements will be omitted below.

In the example embodiment, the substrate 10 may include connectors 22' therein. The connectors 22' may include vias and conductive patterns. The connectors 22' may electrically connect the upper substrate pads 20 to a flexible substrate connectors 26. At least one external terminal 30' may be provided on one of top and bottom surfaces of a connection substrate 14. The connection substrate 14 may include a connection substrate connectors 28. The connection substrate connector 28 may electrically connect the external terminal 30' to the flexible substrate connector 26. The connection substrate connector 28 and the external terminal 30' may be made up of a conductive material.

A flexible substrate 12 may be provided between the substrate 10 and the connection substrate 14. For example, the flexible substrate 12 may have one end coupled to one side of the substrate 10 and the other end coupled to one side of the connection substrate 14. The flexible substrate 12 may be made up of a dielectric polymer. For example, the flexible substrate 12 may be made up of a polyimide-based polymer. The flexible substrate 12 may include the flexible substrate connector 26 therein. The flexible substrate 12 may be readily bent. When the flexible substrate 12 is bent, the flexible substrate connector 26 provided in the flexible substrate 12 may also be bent. The flexible substrate connector 26 may have one end coupled to the connectors 22' and the other end coupled to the connection substrate connector 28. The flexible substrate connector 26 may electrically connect the connectors 22' to the connection substrate connector 28. Accordingly, in the example embodiment, electric signals provided from the image sensor chip 400b may be externally output through the chip connection pads 50, the bonding wires 40, the upper substrate pads 20, the connectors 22', the flexible substrate connector 26, the connection substrate connector 28, and the external terminal 30', in that order.

Figure 3C:
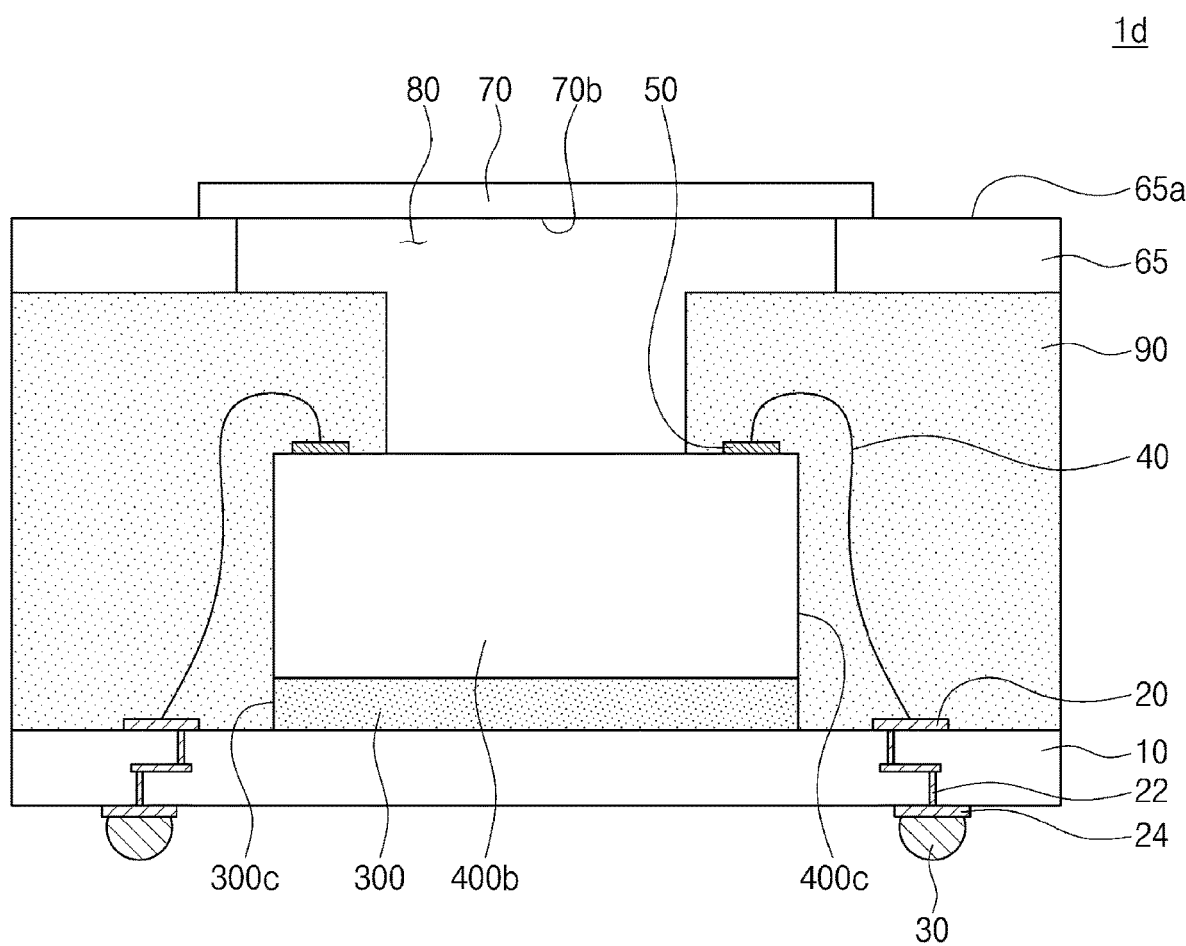
FIG. 3C illustrates a cross-sectional view of an image sensor package according to an example embodiment.

FIG. 3C illustrates a cross-sectional view of an image sensor package 1d according to an example embodiment.

Referring to FIG. 3C, an image sensor package 1d according to an example embodiment may include a substrate 10, an adhesive film 300, an image sensor chip 400b, bonding wires 40, a molding layer 90, a filter supporter 65, and an infrared filter 70. The substrate 10, the adhesive film 300, the image sensor chip 400b, and the bonding wires 40 may be the same as those discussed in FIGS. 2A and 2B. The infrared filter 70 may be the same as that discussed in FIG. 3A. Thus, duplicate descriptions of these elements will be omitted below.

In the example embodiment, the molding layer 90 may be provided on the substrate 10 and may cover the lateral surfaces 300c of the adhesive film 300, the lateral surfaces 400c of the image sensor chip 400b, and the edge region of the top surface of the image sensor chip 400b. The molding layer 90 may thus encapsulate the chip connection pads 50 and the bonding wires 40. However, because the molding layer 90 does not cover a central portion of the image sensor chip 400b, the image sensor chip 400b may be exposed to light that passes through the infrared filter 70. The molding layer 90 may include a dielectric polymer, for example, an epoxy-based polymer. The molding layer 90 may protect the image sensor chip 400b and the bonding wires 40 against external impact and foreign object.

The filter supporter 65 may be provided on a top surface of the molding layer 90 and support the infrared filter 70. The filter supporter 65 may fix the infrared filter 70.

In another example embodiment, the substrate 10 may be replaced with the substrate 10, the flexible substrate 12, and the connection substrate 14 discussed in FIG. 3B.

Figure 3D:
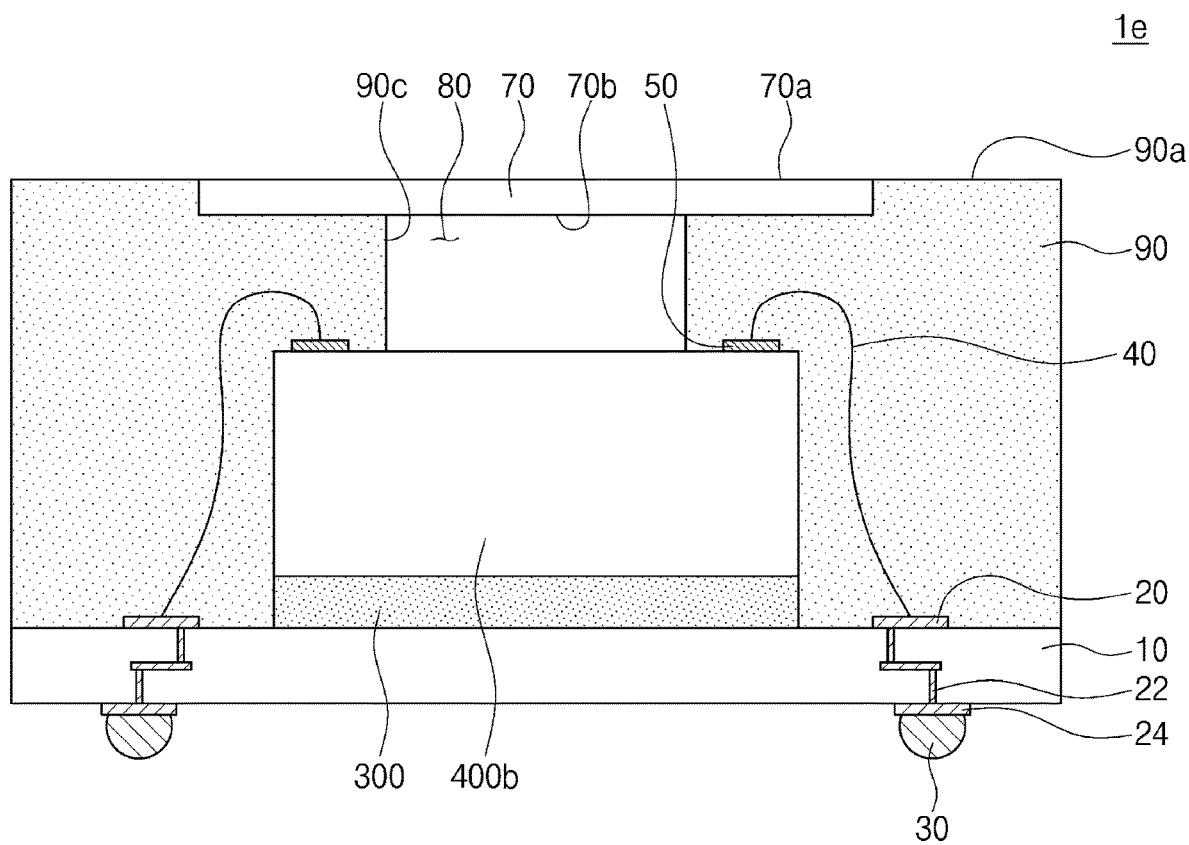
FIG. 3D illustrates a cross-sectional view of an image sensor package according to an example embodiment.

FIG. 3D illustrates a cross-sectional view of an image sensor package 1e according to an example embodiment.

Referring to FIG. 3D, an image sensor package 1e according to an example embodiment may include a substrate 10, an adhesive film 300, an image sensor chip 400b, bonding wires 40, a molding layer 90, and an infrared filter 70. The substrate 10, the adhesive film 300, the image sensor chip 400b, and the bonding wires 40 may be the same as those discussed in FIGS. 2A and 2B. The molding layer 90 may be the same as that discussed in FIG. 3C. Thus, duplicate descriptions of those features will be omitted below.

The infrared filter 70 may be provided over a top surface of the image sensor chip 400b. The infrared filter 70 may be vertically spaced apart from and may face the image sensor chip 400b. The infrared filter 70 may have a bottom surface 70b located at a lower level than that of a top surface 90a of the molding layer 90. Accordingly, it may be possible to reduce a height of the image sensor package 1e and to achieve compactness of an image sensor package. The empty space 80 may be formed between the infrared filter 70 and the image sensor chip 400b. The empty space 80 may also be surrounded by an inner sidewall 90c of the molding layer 90. Differently from that shown, the substrate 10 may be replaced with the substrate 10, the flexible substrate 12, and the connection substrate 14 discussed in FIG. 3B.

Figure 3E:
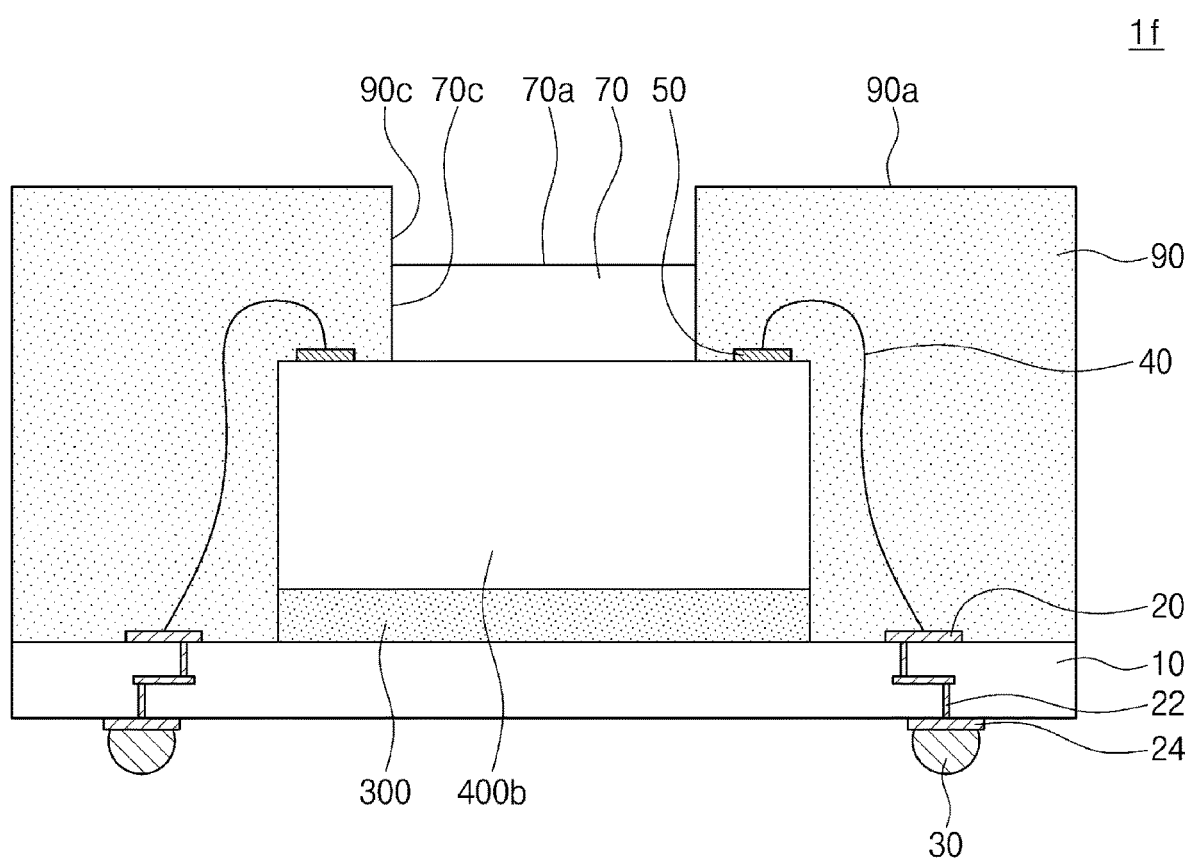
FIG. 3E illustrates a cross-sectional view of an image sensor package according to an example embodiment.

FIG. 3E illustrates a cross-sectional view showing an image sensor package 1f according to an example embodiment.

Referring to FIG. 3E, an image sensor package 1f according to an example embodiment may include a substrate 10, an adhesive film 300, an image sensor chip 400b, bonding wires 40, a molding layer 90, and an infrared filter 70. The substrate 10, the adhesive film 300, the image sensor chip 400b, and the bonding wires 40 may be the same as those discussed in FIGS. 2A and 2B. The molding layer 90 may be the same as that discussed in FIG. 3C or 3D. Thus, duplicate descriptions of these features will be omitted below.

The infrared filter 70 may be provided on the top surface of the image sensor chip 400b. The infrared filter 70 may have a bottom surface in direct contact with the top surface of the image sensor chip 400b. The infrared filter 70 may cover the central portion of the image sensor chip 400b. The infrared filter 70 may have a top surface 70a provided at a position lower than the top surface 90a of the molding layer 90 and higher than the top surface of the image sensor chip 400b. The infrared filter 70 may have lateral surfaces 70c in contact with the inner sidewall 90c of the molding layer 90. In another example embodiment, the substrate 10 may be replaced with the substrate 10, the flexible substrate 12, and the connection substrate 14 discussed in FIG. 3B.

Figure 3F:
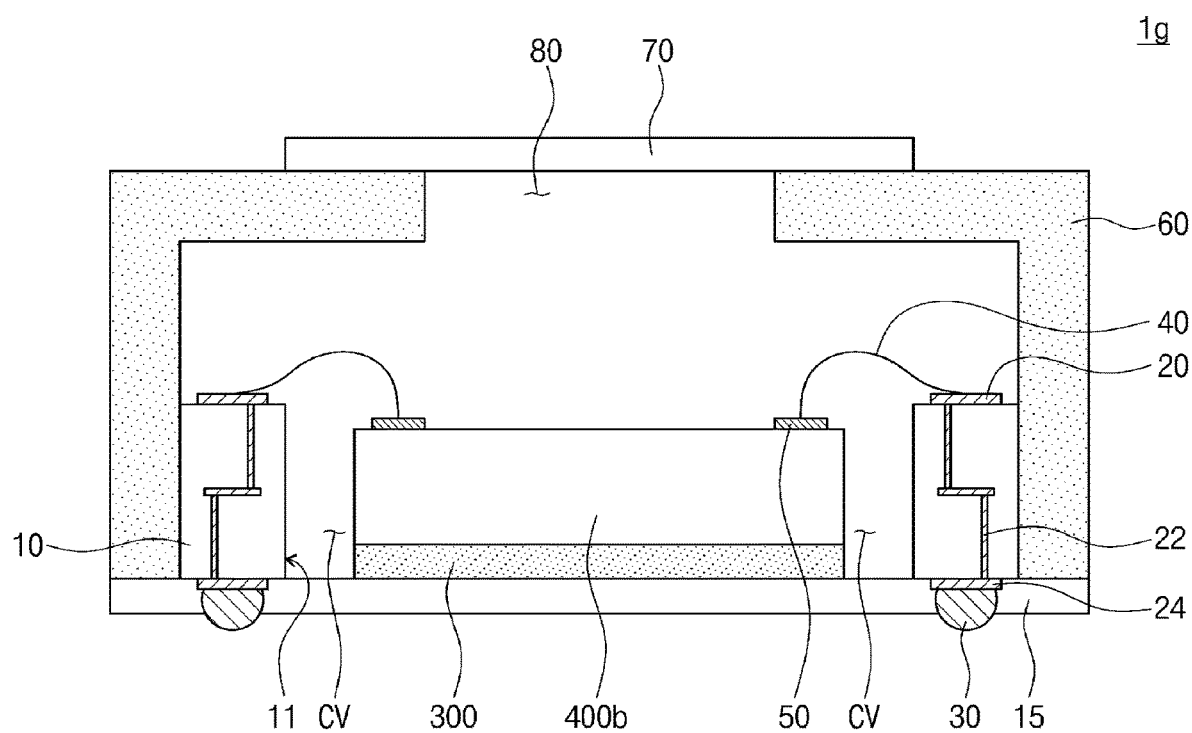
FIG. 3F illustrates a cross-sectional view of an image sensor package according to an example embodiment.

FIG. 3F illustrates a cross-sectional view of an image sensor package 1g according to an example embodiment.

Referring to FIG. 3F, an image sensor package 1g according to an example embodiment may include a substrate 10, a stiffener 15, an adhesive film 300, an image sensor chip 400b, bonding wires 40, a holder 60, and an infrared filter 70. The adhesive film 300, the image sensor chip 400b, and the bonding wires 40 may be the same as those discussed in FIGS. 2A and 2B. The holder 60 and the infrared filter 70 may be the same as those discussed in FIG. 3A or 3B. Thus, duplicate descriptions of these features will be omitted below.

In this example embodiment, the stiffener 15 may be prepared. The stiffener 15 may include a stainless steel. The stiffener 15 may serve to support the substrate 10 and the image sensor chip 400b.

The substrate 10 may be provided on a top surface of the stiffener 15. The substrate 10 may be a printed circuit board (PCB). The substrate 10 may have a hole 11 penetrating the top and bottom surfaces thereof. The hole 11 may provide a cavity CV inside the substrate 10. The cavity CV may be spatially connected to the empty space 80. The adhesive film 300 and the image sensor chip 400b may be provided in the cavity CV on the stiffener 15. The top surface of the image sensor chip 400b may be located at a lower level than that of the top surface of the substrate 10. Because the image sensor chip 400b is provided in the cavity CV of the substrate 10, it may be possible to reduce a height of the image sensor package 1g and in turn to achieve compactness of products.

Figure 3G:
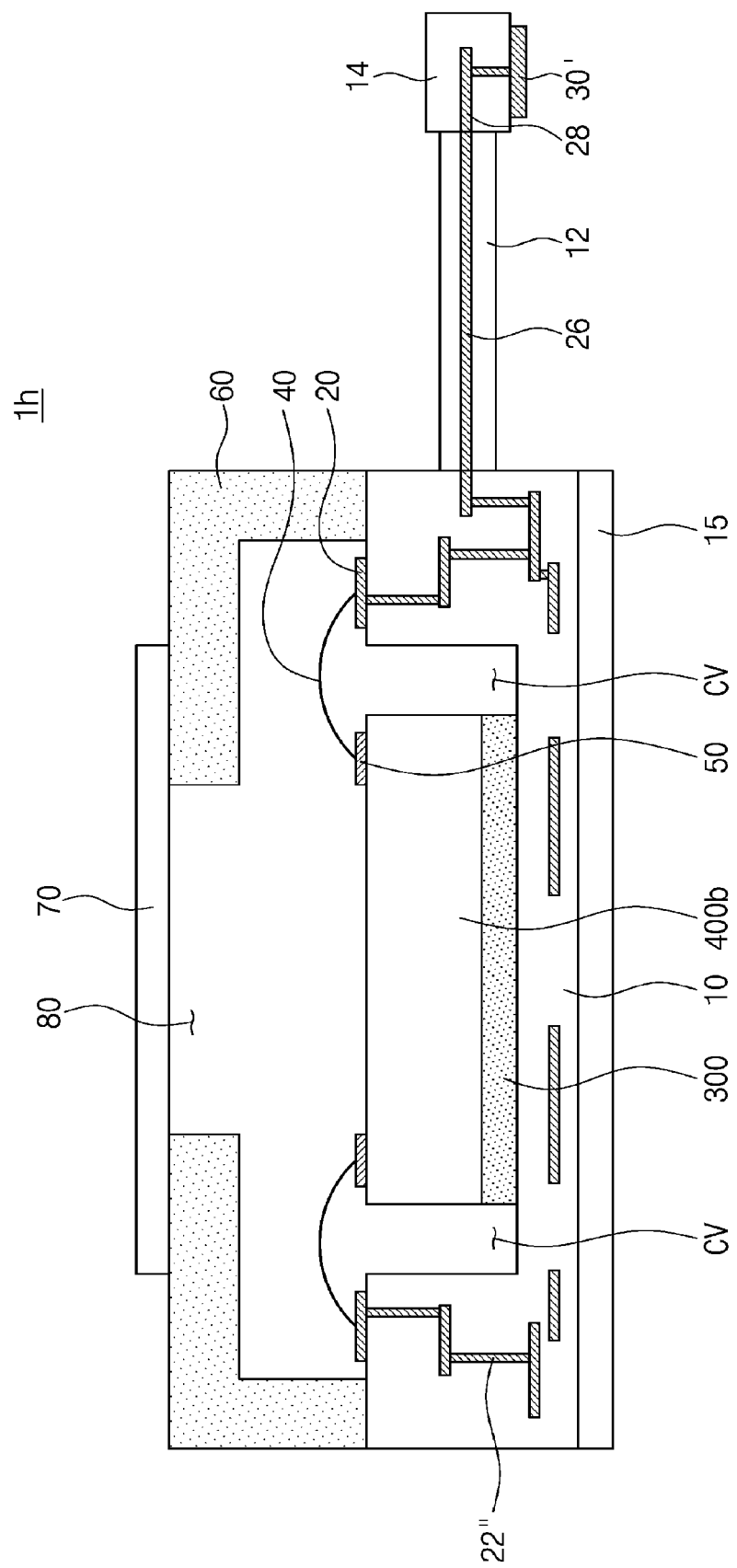
FIG. 3G illustrates a cross-sectional view of an image sensor package according to an example embodiment.

FIG. 3G illustrates a cross-sectional view of an image sensor package 1h according to an example embodiment.

Referring to FIG. 3G, an image sensor package 1h according to an example embodiment may include a substrate 10, a stiffener 15, an adhesive film 300, an image sensor chip 400b, bonding wires 40, a holder 60, and an infrared filter 70. The adhesive film 300, the image sensor chip 400b, and the bonding wires 40 may be the same as those discussed in FIGS. 2A and 2B. The holder 60 and the infrared filter 70 may be the same as those discussed in FIG. 3A or 3B. The stiffener 15 may be the same as that discussed in FIG. 3F. Thus, duplicate descriptions of these features will be omitted below.

The substrate 10 may be provided on the top surface of the stiffener 15. The substrate 10 may have a hole 11 penetrating the top and bottom surfaces thereof. The hole 11 may provide a cavity CV in the substrate 10. The adhesive film 300 and the image sensor chip 400b may be provided in the cavity CV. The substrate 10 may include connectors 22" therein. The connectors 22" may electrically connect the upper substrate pads 20 to the flexible substrate connector 26. The flexible substrate connector 26 may electrically connect the connectors 22" to the connection substrate connector 28. The connection substrate connector 28 may electrically connect the flexible substrate connector 26 to the external terminal 30'. Accordingly, electric signals provided from the image sensor chip 400b may be externally output through the chip connection pads 50, the bonding wires 40, the upper substrate pads 20, the connectors 22", the flexible substrate connector 26, the connection substrate connector 28, and the external terminal 30'.

FIGS. 4A to 4H illustrate cross-sectional views illustrating a method of manufacturing an image sensor package according to an example embodiment. A description discussed with reference to FIGS. 1A to 1H may also be identically or similarly applicable to the following embodiment illustrated in FIGS. 4A to 4H, and thus the repetitive description will be omitted to avoid redundancy.

Referring to FIG. 4A, a first base film 100a may be prepared. A first fixing ring 500 may be attached to opposite ends of the first base film 100a. A first intermediate layer 200a may be provided on a top surface of the first base film 100a. An anisotropic conductive film (ACF) may be provided on a top surface of the first intermediate layer 200a. The anisotropic conductive film may include an adhesive film 300 and conductive particles 302. The conductive particles 302 may be provided in the adhesive film 300. The conductive particles 302 may be uniformly distributed in the adhesive film 300. The adhesive film 300 may be provided on a top surface of first intermediate layer 200a in a half-cured state (or a semi-cured state). The adhesive film 300 may be in a half-solid state (or a semi-solid state). Afterwards, the adhesive film 300 may be annealed and then completely cured. A semiconductor wafer 400a may be prepared with lower chip pads 420 and conductive vias T provided therein. The lower chip pads 420 may be provided on a bottom surface of the semiconductor wafer 400a. The conductive vias T may penetrate through the semiconductor wafer 400a. The conductive vias T may be vertically aligned with the lower chip pads 420. The semiconductor wafer 400a may be provided to allow its bottom surface to face the adhesive film 300.

Referring to FIG. 4B, the semiconductor wafer 400a may be diced to form a plurality of image sensor chips 400b and a plurality of grooves 600. The plurality of grooves 600 may penetrate through the adhesive film 300 and the first intermediate layer 200a.

Figure 4C:
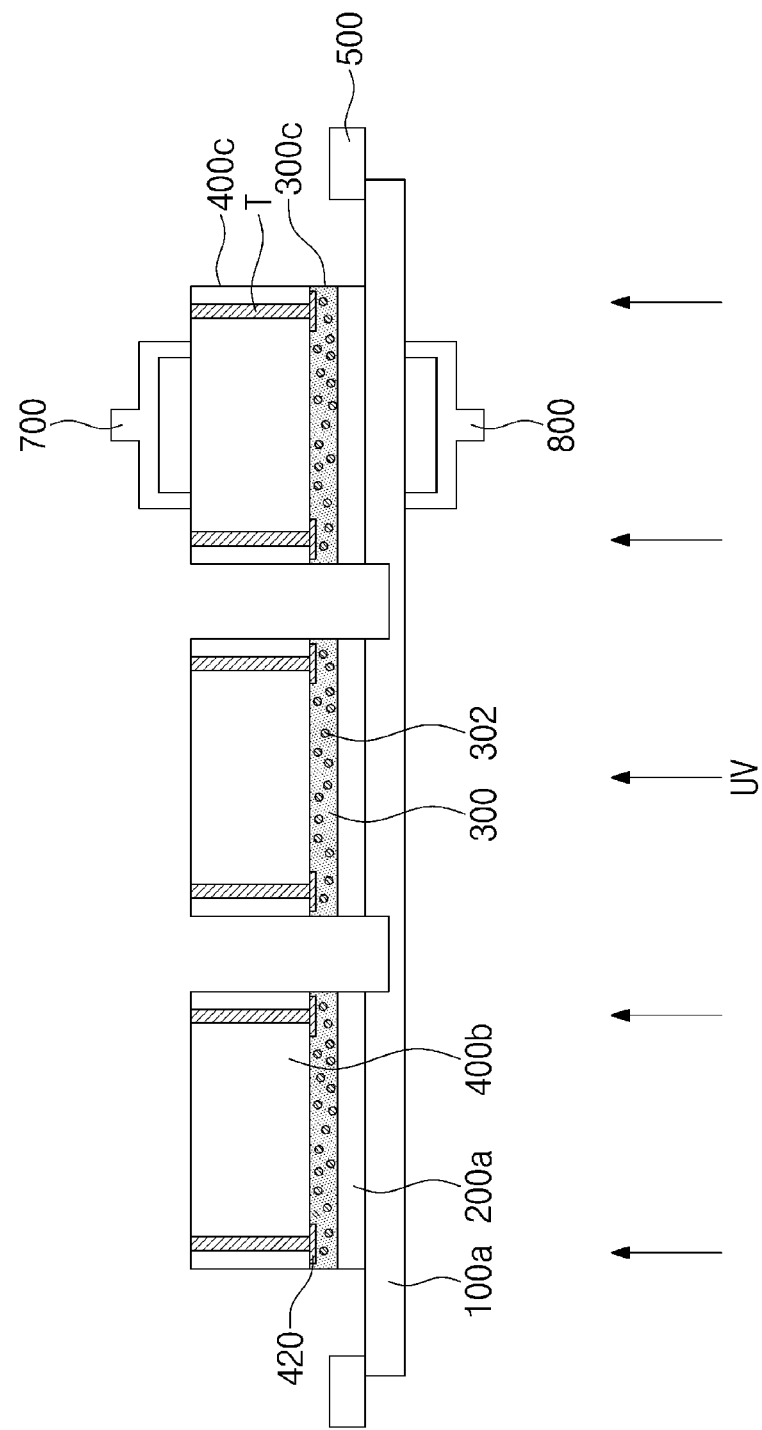

Referring to FIG. 4C, the first intermediate layer 200a may be irradiated with an ultraviolet ray. After the first intermediate layer 200a is exposed to the ultraviolet ray, a chip collector 700 may be provided on a top surface of one of the image sensor chips 400b. The chip collector 700 may convey the image sensor chip 400b and its attached adhesive film 300 to a desired position. An ejector pin 800 may be provided on a bottom surface of the first base film 100a to further support the separation.

Figure 4D:
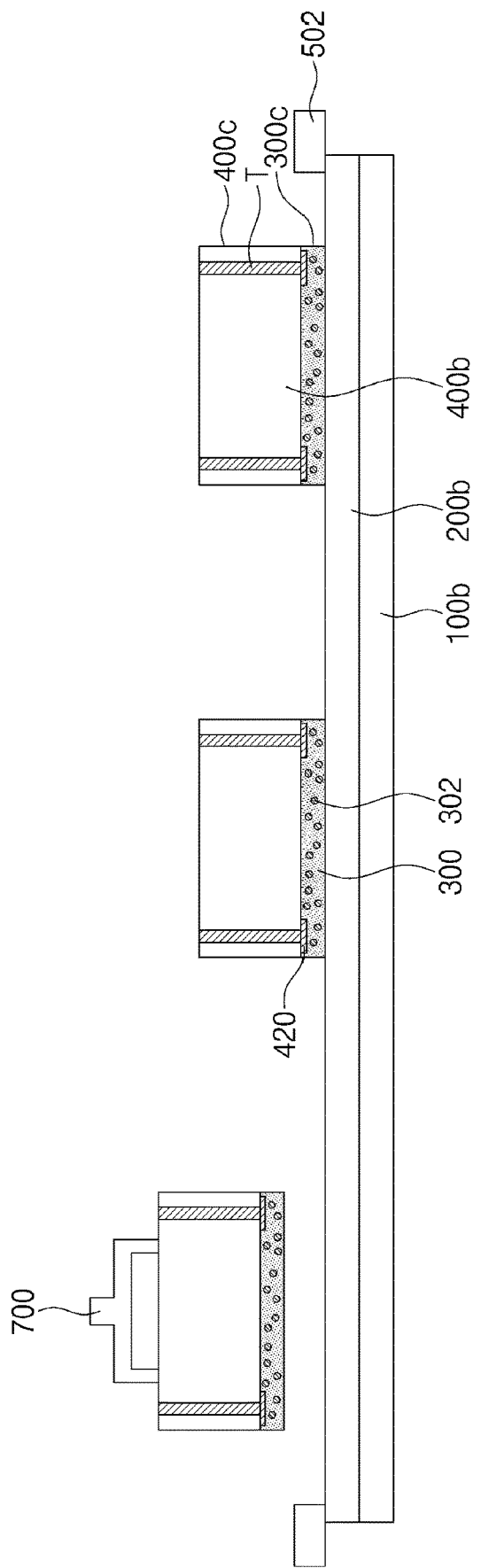

Referring to FIG. 4D, the image sensor chip 400b and the adhesive film 300 being held by the chip collector 700 as discussed in FIG. 4C may be transported toward a top surface of a second intermediate layer 200b, and then the image sensor chip 400b and the adhesive film 300 may be provided on the second intermediate layer 200b.

Referring to FIG. 4E, the second intermediate layer 200b may be irradiated with an ultraviolet ray. After the second intermediate layer 200b is exposed to the ultraviolet ray, the chip collector 700 may be provided on a top surface of an image sensor chip 400b. The chip collector 700 may hold onto the top surface of the image sensor chips 400b, and may lift up the image sensor chip 400b.

Figure 4F:
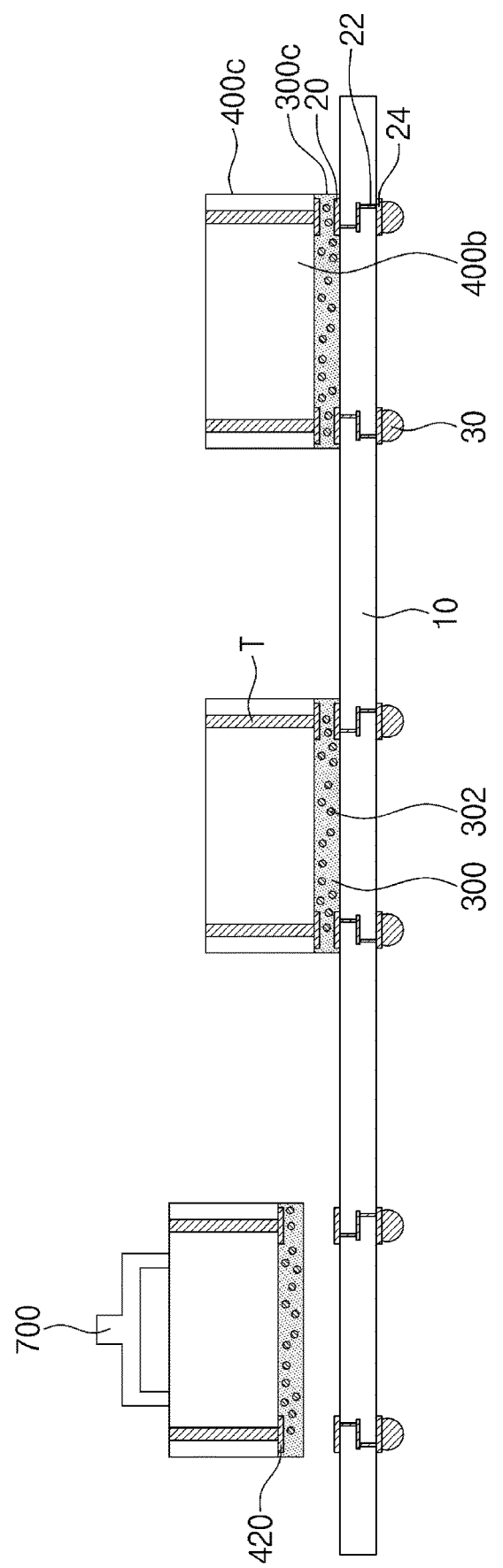

Referring to FIG. 4F, a substrate 10 may be prepared. The image sensor chip 400b held by the chip collector 700 as discussed in FIG. 4E may be transported onto a top surface of the substrate 10, and then the substrate 10 may be provided with the image sensor chip 400b on the top surface thereof. The adhesive film 300 may also move together with the image sensor chip 400b. At this stage, the image sensor chip 400b may be disposed on the substrate 10 in order to align the lower chip pads 420 with corresponding upper substrate pads 20.

Referring to FIG. 4G, the adhesive film 300 and the conductive particles 302 may be heated and pressurized. The applied heat and pressure may force the conductive particles 302 to flow and aggregate in the adhesive film 300. Specifically, the conductive particles 302 may aggregate between the lower chip pads 420 and the upper substrate pads 20. The conductive particles 302 may aggregate to form conductors 304. The conductors 304 may electrically connect the lower chip pads 420 to the upper substrate pads 20. The conductors 304 may be surrounded by the adhesive film 300.

Referring to FIG. 4H, the substrate 10 may be diced to form image sensor packages 1i. Each of the image sensor packages 1i may include the substrate 10, the adhesive film 300, the conductors 304, the conductive vias T, and the image sensor chip 400b.

The following will describe a single image sensor package.

Figure 5:
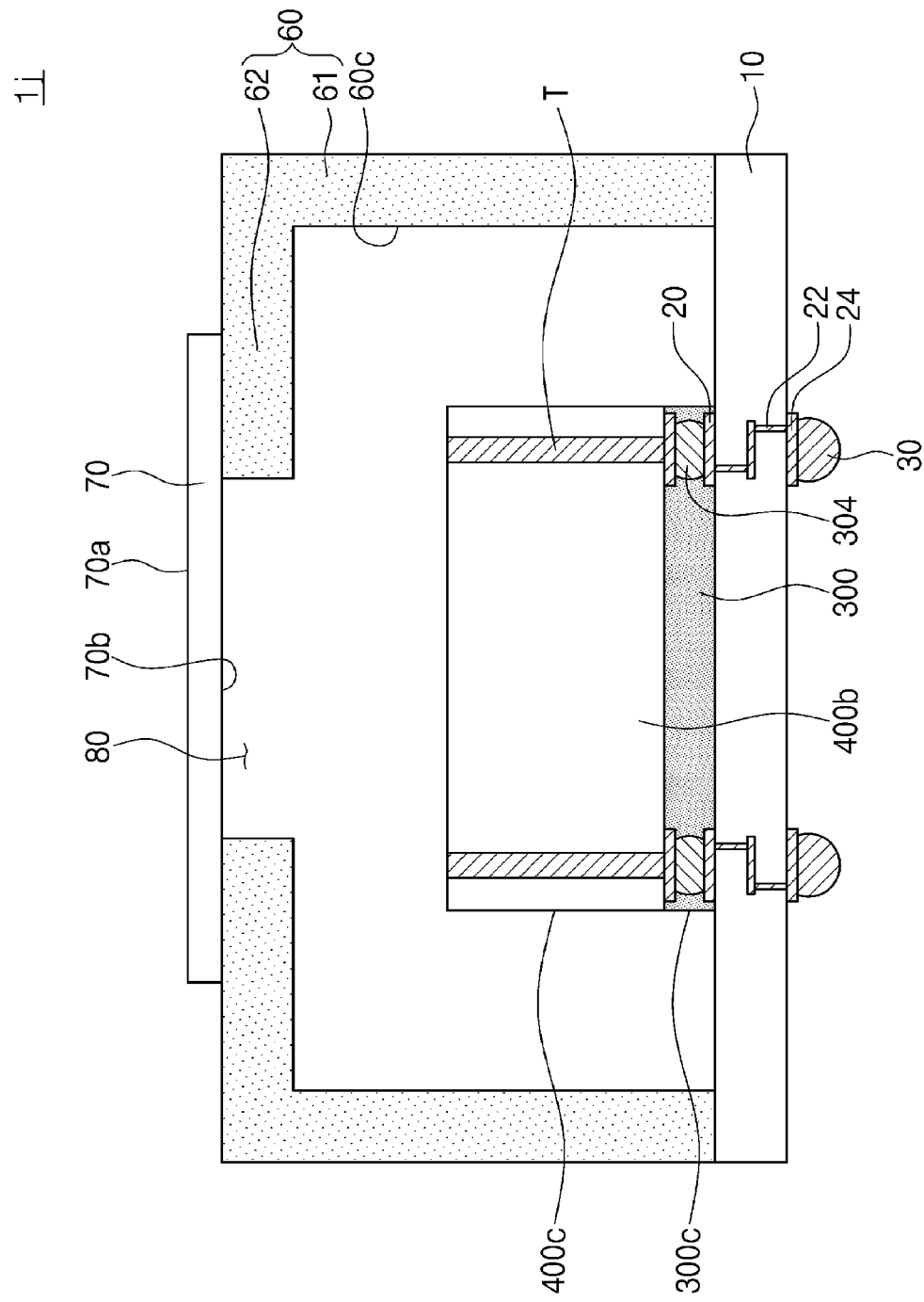
FIG. 5 illustrates a cross-sectional view of an image sensor package according to an example embodiment.

FIG. 5 illustrates a cross-sectional view of an image sensor package 1j according to an example embodiment.

Referring to FIG. 5, an image sensor package 1j according to an example embodiment may include a substrate 10, an adhesive film 300, conductors 304, an image sensor chip 400b, a holder 60, and an infrared filter 70. The substrate 10, the image sensor chip 400b, the holder 60, and the infrared filter 70 may be substantially the same as those discussed in FIG. 3A, and thus the repetitive description will be omitted below. The substrate 10, the conductors 304, the image sensor chip 400b, and the adhesive film 300 may be manufactured as discussed above in conjunction with FIGS. 4A to 4G.

Referring back to FIG. 4G, the conductive particles 302 may aggregate such that the conductors 304 may be provided between the lower chip pads 420 and the upper substrate pads 20. The conductors 304 may contact and electrically connect the lower chip pads 420 and the upper substrate pads 20. Accordingly, electric signals provided from the image sensor chip 400b may externally output through the conductive vias T, the lower chip pads 420, the conductors 304, the upper substrate pads 20, the connectors 22, the lower substrate pads 24, and the external terminals 30. In another example embodiment, the holder 60 may be replaced with the molding layer 90 discussed in FIG. 3C or 3D. In another example embodiment, the substrate 10 may be replaced with the substrate 10, the flexible substrate 12, and the connection substrate 14 discussed in FIG. 3B.

FIGS. 6A to 6E illustrate cross-sectional views describing a method of manufacturing an image sensor package according to an example embodiment. A description discussed with reference to FIGS. 1A to 1H may also be identically or similarly applicable to the following example embodiment illustrated in FIGS. 6A to 6H, and thus the repetitive description will be omitted to avoid redundancy.

Referring to FIG. 6A, a first base film 100a may be prepared. A first fixing ring 500 may be attached to opposite ends of the first base film 100a. A first intermediate layer 200a may be provided on a top surface of the first base film 100a. An adhesive film 300 may be provided on a top surface of the first intermediate layer 200a. The adhesive film 300 may be a non-conductive film (NCF). A semiconductor wafer 400a may be prepared with lower chip pads 420, conductive terminals 440, and conductive vias T formed therein. The lower chip pads 420 may be provided on a bottom surface of the semiconductor wafer 400a. The conductive terminals 440 may be provided on bottom surfaces of the lower chip pads 420. The conductive vias T may penetrate the semiconductor wafer 400a. The conductive vias T may be vertically aligned with the lower chip pads 420. The semiconductor wafer 400a may be provided to allow its bottom surface to face the adhesive film 300.

Referring to FIG. 6B, the semiconductor wafer 400a may be diced to form a plurality of image sensor chips 400b and a plurality of grooves 600. The grooves 600 may penetrate through the adhesive film 300 and the first intermediate layer 200a.

Figure 6C:
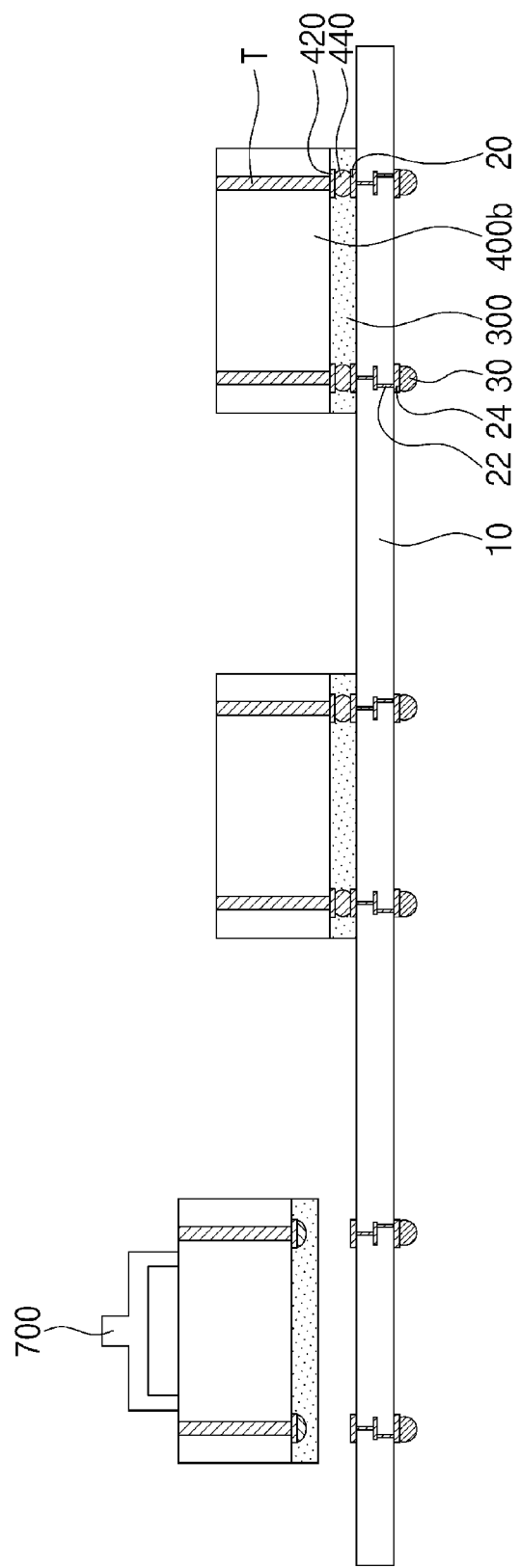

Referring to FIG. 6C, a substrate 10 may be prepared. The method discussed in FIGS. 1C to 1E may be performed such that one of the image sensor chips 400b of FIG. 6B is transported onto a top surface of the substrate 10, and that the substrate 10 may be provided with the image sensor chip 400b on the top surface thereof. One of the adhesive films 300 that is in contact with the image sensor chip 400b may also move onto the top surface of the substrate 10. The image sensor chip 400b may be disposed to align the conductive terminals 440 with corresponding upper substrate pads 20. The conductive terminals 440 may be vertically spaced apart from the upper substrate pads 20. The adhesion film 300 may be interposed between the conductive terminals 440 and the upper substrate pads 20.

Referring to FIG. 6D, the adhesive film 300 may be heated to have fluidity. The image sensor chip 400b may be provided with pressure in a direction perpendicular to a top surface of the substrate 10. Therefore, the conductive terminals 440 may contact and have electrical connection with corresponding upper substrate pads 20.

Referring to FIG. 6E, the substrate 10 may be diced to form a plurality of image sensor packages 1k. Each of the image sensor packages 1k may include the substrate 10, the adhesive film 300, the image sensor chip 400b, and the conductive terminals 440.

The following will describe a single image sensor package.

FIG. 7 illustrates a cross-sectional view of an image sensor package according to an example embodiment.

Referring to FIG. 7, an image sensor package 1l according to an example embodiment may include a substrate 10, an adhesive film 300, conductive terminals 440, an image sensor chip 400b, a holder 60, and an infrared filter 70. The substrate 10, the holder 60, and the infrared filter 70 may be substantially the same as those discussed in FIG. 3A. The substrate 10, the image sensor chip 400b, the conductive terminals 440, and the adhesive film 300 may be manufactured as discussed above in conjunction with FIGS. 6A to 6E. The conductive terminals 440 may be provided on top surfaces of the upper substrate pads 20, respectively. The conductive terminals 440 may be positioned in the adhesive film 300. The conductive terminals 440 may correspondingly contact the lower chip pads 420 and the upper substrate pads 20. The conductive terminals 440 may electrically connect the lower chip pads 420 to the upper substrate pads 20. Accordingly, electric signals provided from the image sensor chip 400b may externally output through the conductive vias T, the lower chip pads 420, the conductive terminals 440, the upper substrate pads 20, the connectors 22, the lower substrate pads 24, and the external terminals 30. In another example embodiment, the holder 60 may be replaced with the molding layer 90 discussed in FIG. 3C or 3D. In another example embodiment, the substrate 10 may be replaced with the substrate 10, the flexible substrate 12, and the connection substrate 14 discussed in FIG. 3B.

An image sensor package according to example embodiments of the present inventive concepts may include an adhesive film on a bottom surface of an image sensor chip. Therefore, the image sensor package may increase in performance and production yield.

Effects of the present inventive concepts are not limited to the mentioned above, other effects which have not been mentioned above will be clearly understood to those skilled in the art from the following description.

While example embodiments have been shown and described above, it will be apparent to those skilled in the art that modifications and variations could be made without departing from the scope of the present disclosure, as defined by the appended claims.

What is claimed is:

1. An image sensor package, comprising:
   a substrate;
   an image sensor chip provided on the substrate;
   an adhesive film provided between the image sensor chip and the substrate; and
   a plurality of conductive terminals provided on a top surface of the substrate,
   wherein the plurality of conductive terminals are positioned inside the adhesive film,
   a width of the adhesive film is equal to a width of the image sensor chip,
   the adhesive film comprises conductive particles uniformly distributed in a random manner, wherein the adhesive film is characterized by a first thermal expansion coefficient, and the first thermal expansion coefficient is less than a second thermal expansion coefficient of an epoxy-based polymer, and
   the conductive particles are configured to flow and aggregate in the adhesive film between the conductive terminals provided on the top surface of the substrate and conductive pads of the image sensor package.

2. The image sensor package of claim 1, wherein a ratio of a maximum thickness of the adhesive film to a minimum thickness of the adhesive film is in a range of 1 to 1.15.

3. The image sensor package of claim 1, wherein, in a plan view, an area of the image sensor chip is equal to an area of the adhesive film.

4. The image sensor package of claim 1, wherein lateral surfaces of the adhesive film are coplanar with corresponding lateral surfaces of the image sensor chip.

5. The image sensor package of claim 1, wherein lateral surfaces of the adhesive film are perpendicular to a top surface of the substrate.

6. The image sensor package of claim 1, wherein a glass transition temperature (Tg) of the adhesive film is in a range of 140° C. to 170° C.

7. The image sensor package of claim 1, wherein the adhesive film comprises an epoxy-based polymer and silica.

8. The image sensor package of claim 1, further comprising a plurality of conductive vias penetrating through the image sensor chip,
wherein the plurality of conductive vias electrically connect the image sensor chip to the substrate.

9. An image sensor package, comprising:
a substrate;
an image sensor chip provided on the substrate;
an adhesive film provided between the image sensor chip and the substrate; and
a plurality of conductive terminals provided on a top surface of the substrate,
wherein the plurality of conductive terminals are positioned inside the adhesive film,
lateral surfaces of the adhesive film are coplanar with corresponding lateral surfaces of the image sensor chip in a thickness direction of the image sensor package,
the adhesive film comprises conductive particles uniformly distributed in a random manner, wherein the adhesive film is characterized by a first thermal expansion coefficient, and the first thermal expansion coefficient is less than a second thermal expansion coefficient of an epoxy-based polymer, and
the conductive particles are configured to flow and aggregate in the adhesive film between the conductive terminals provided on the top surface of the substrate and conductive pads of the image sensor package.

10. The image sensor package of claim 9, wherein a ratio of a maximum thickness of the adhesive film to a minimum thickness of the adhesive film is in a range of 1 to 1.15.

11. The image sensor package of claim 9, wherein a width of the adhesive film is equal to a width of the image sensor chip.

12. The image sensor package of claim 9, wherein a planar area of the adhesive film is equal to a planar area of the image sensor chip.

13. The image sensor package of claim 12, wherein the lateral surfaces of the adhesive film are perpendicular to a top surface of the substrate.

14. The image sensor package of claim 9, wherein the image sensor chip comprises a plurality of conductive vias provided in the image sensor chip.

15. The image sensor package of claim 9, further comprising:
a molding layer provided on a top surface of the substrate; and
an infrared filter provided on a top surface of the molding layer,
wherein a bottom surface of the infrared filter is located at a level lower than a level of the top surface of the molding layer.

16. The image sensor package of claim 15, wherein the bottom surface of the infrared filter is in direct contact with a top surface of the image sensor chip.

17. An image sensor package, comprising:
a substrate;
an image sensor chip provided on the substrate; and
an adhesive film provided between the image sensor chip and the substrate, wherein the adhesive film is configured to control a tilt of the sensor chip with respect to the substrate,
wherein a first thermal expansion coefficient of the adhesive film is less than a second thermal expansion coefficient of an epoxy-based polymer,
a glass transition temperature (Tg) of the adhesive film is in a range of 140° C. to 170° C., and
a ratio of a maximum thickness of the adhesive film to a minimum thickness of the adhesive film is in a range of 1 to 1.15.

* * * * *